(12) United States Patent
Kodama

(10) Patent No.: US 7,176,727 B2
(45) Date of Patent: Feb. 13, 2007

(54) SYNTHESIZER

(75) Inventor: Hiroshi Kodama, Tokyo (JP)

(73) Assignee: NEC Corporation, Tokyo (JP)

( * ) Notice: Subject to any disclaimer, the term of this patent is extended or adjusted under 35 U.S.C. 154(b) by 84 days.

(21) Appl. No.: 10/889,122

(22) Filed: Jul. 13, 2004

(65) Prior Publication Data

US 2005/0012528 A1    Jan. 20, 2005

(30) Foreign Application Priority Data

Jul. 14, 2003 (JP) ............................. 2003-273920
Dec. 25, 2003 (JP) ............................. 2003-431200

(51) Int. Cl.
*H03B 21/00* (2006.01)

(52) U.S. Cl. ...................... 327/105; 327/107

(58) Field of Classification Search ................ 327/136, 327/105–107, 113, 114, 156; 375/375, 376, 375/371
See application file for complete search history.

(56) References Cited

U.S. PATENT DOCUMENTS

| | | | | |
|---|---|---|---|---|
| 3,036,157 A | * | 5/1962 | Franco et al. ................ | 375/280 |
| 6,621,317 B2 | * | 9/2003 | Saeki .......................... | 327/163 |
| 6,980,036 B2 | * | 12/2005 | Kwon et al. ................. | 327/116 |

FOREIGN PATENT DOCUMENTS

| | | |
|---|---|---|
| JP | 2-67821 A | 3/1990 |
| JP | 2-230821 A | 9/1990 |
| JP | 4-96515 A | 3/1992 |
| JP | 04-235416 A | 8/1992 |
| JP | 4-345319 A | 12/1992 |
| JP | 5-291949 A | 11/1993 |
| JP | 6-125269 A | 5/1994 |
| JP | 7-162303 A | 6/1995 |
| JP | 11-168378 A | 6/1999 |
| JP | 2000-34110 A | 12/2000 |
| JP | 2001-209454 A | 8/2001 |
| JP | 2003-23087 A | 1/2003 |

OTHER PUBLICATIONS

RF Microelectronics, Chapter 8 Frequency Synthesizers, p. 252, Fig. 8.8, 1998.
RF Microelectronics, Section 7.9 Single-Sideband Generation, p. 244, Fig. 7.46, 1998.
RF Microelectronics, Section 8.3 RF Synthesizer Architectures, p. 285 to 289, Fig. 8.47, 1998.

* cited by examiner

*Primary Examiner*—Dinh T. Le
(74) *Attorney, Agent, or Firm*—Sughrue Mion, PLLC

(57) ABSTRACT

A synthesizer that has a phase detector 8 and a charge pump circuit 9 for injecting an electric charge, or pulling it out that corresponded to a frequency difference of an input, a low-pass filter 11 for converting this electric charge into a voltage, a voltage control oscillator (VCO) 13 for changing an output frequency for this input voltage, a divider 14 for dividing the frequency of the input, and a voltage holding circuit 10 for holding the input voltage for a plurality of output frequencies of the VCO. A holding voltage of the voltage holding circuit 10 is switched with a switch 12, and the frequency of an output clock signal 3 is switched.

8 Claims, 26 Drawing Sheets

SYNTHESIZER

BACKGROUND OF THE INVENTION

The present invention relates to a synthesizer, and more particularly to a synthesizer that is employed for a frequency hopping and is capable of switching a frequency at a high speed.

Conventionally, the synthesizer of this kind is employed on the ground that it can generate an output clock signal of which a frequency is multiple times as great as an input clock frequency (for example, a non-patent document 1)

[Non-Patent Document 1]

RF Microelectronics, p. 252, FIG. 8.8, 1998. One example of such a first conventional synthesizer is shown in FIG. 35.

As shown in FIG. 35, the synthesizer that is a conventional example is configured of a phase detector 1025, a charge pump circuit 1026, a low-pass filter 1027, a voltage control oscillator (VCO) 1028, and a divider 1029.

Next, an operation of the above-mentioned synthesizer will be explained.

The phase detector 1025 and the charge pump circuit 1026 inject an electric charge into the low-pass filter 1027, or pull it out responding to a frequency difference between an input clock signal 1021 and an output signal 1024 of the divider 1029, and an input voltage 1022 of the VCO 1028 is feedback-controlled in such a manner that a frequency difference between the input clock signal 1021 and the output signal 1024 of the divider 1029 is decreased.

Continually, the VCO 1028 changes the frequency of an output clock signal 1023 with the input voltage 1022. And, when a frequency difference between the input clock signal 1021 and the output signal 1024 of the divider amounted to 0 (zero), the circuit operates in a stationary state. At this moment, the frequency of the output clock signal 1023 becomes a frequency obtained by increasing the frequency of the input clock signal 1021 by a factor of a frequency dividing rate.

Also, a second conventional synthesizer is employed on the ground that the output signal having a frequency of $\omega 1 \pm \omega 2$ is obtained from the input signal having a frequency $\omega 1$ and the input signal having a frequency $\omega 2$ (for example, a non-patent document 2)

[Non-Patent Document 2]

RF Microelectronics, p. 244, FIG. 7.46, 1998. One example of such a second conventional synthesizer is shown in FIG. 36.

As shown in FIG. 36, the second conventional synthesizer is configured of a mixer 1103, and a band pass filter 1105.

Next, an operation of the second conventional synthesizer will be explained.

At first, by inputting a first input signal 1101 of which a frequency is $\omega 1$, and a second input signal 1102 of which a frequency is $\omega 2$ into the mixer 1103, a mixer output signal 1104 of which a frequency is $\omega 1 \pm \omega 2$ is obtained.

Next, by inputting this mixer output signal 1104 into the band pass filter 1105, and by removing the other signal than $\omega 1 + \omega 2$ or $\omega 1 - \omega 2$, an output signal 1106 of the band pass filter having one peak of a spectrum is obtained.

Also, a third conventional synthesizer was employed on the ground that the output clock signal frequency was able to be switched in a fine adjustment manner, and at a high speed (for example, a non-patent document 3).

[Non-Patent Document 3]

RF Microelectronics, p. 285 to 289, FIG. 8.47, 1998. Such a third conventional synthesizer is shown in FIG. 37.

As shown in FIG. 37, the third conventional synthesizer is configured of a counter 1202, and a DA converter 1204.

Next, an operation of the third conventional synthesizer will be explained. The counter 1202 counts a clock number of an input clock signal 1201. Continually, an output signal 1203 of this counter is converted from a digital signal into an analogue signal by the DA converter 1204 to generate an output clock signal 1205. At this moment, the period (frequency) of the output clock signal 1205 is switched with a control signal 1206 of the counter.

A first problem of the foregoing conventional synthesizer lies in that the frequency of the output clock signal is impossible to switch at a high speed. Its reason is that plural-time feedback controls are required until the frequency of the output clock signal comes into a stationary state even though a frequency dividing rate is switched, or the frequency of the input clock signal is switched.

Also, a second problem of the foregoing conventional synthesizer lies in that the frequency of the output clock signal is impossible to switch in a broad band. Its reason is that a central frequency of the band pass filter is impossible to switch responding to the output frequency of this mixer even though the output frequency of the mixer is switched by switching the frequency of the input signal.

Further, a third problem of the foregoing conventional synthesizer lies in that the period of the output clock signal to be switched is impossible to partition, or a period length of the output clock signal to be switched is impossible to adjust finely at a frequency equal to or less than the frequency of the input clock signal. Its reason is that only the counting number of the input clock signal decides the period of the output clock signal.

SUMMARY OF THE INVENTION

The present invention has been accomplished in consideration of the above-mentioned problems, and a task to be solved by the present invention is to provide a synthesizer for switching the frequency of the output clock signal at a high speed.

Also, a task to be solved by the present invention is to provide a synthesizer capable of switching the frequency of the output signal in a broad band.

Also, a task to be solved by the present invention is to provide a synthesizer capable of partitioning the frequency of the output clock signal to be switched, or finely adjusting a period length of the output clock signal to be switched at a frequency equal to or less than the frequency of the input clock signal.

A first invention for solving the above-mentioned tasks, which is a synthesizer, is characterized in being configured so as to pre-hold input voltages that correspond to a plurality of output frequencies of a voltage control oscillator, and to switch the frequencies of the voltage control oscillator by switching these voltages.

A second invention for solving the above-mentioned tasks, which is a synthesizer, is characterized in having: a divider for dividing a frequency of an input; a phase detector and a charge pump circuit for injecting an electric charge, or pulling it out responding to a frequency difference of an input; a low-pass filter for converting said electric charge into a voltage; a voltage control oscillator for changing an output frequency for said voltage; a voltage holding circuit for holding an input voltage for a plurality of the output frequencies of said voltage control oscillator; and a switch for switching said low-pass filter and a holding voltage of said voltage holding circuit.

A third invention for solving the above-mentioned tasks, which is a synthesizer, is characterized in being configured so as to pre-hold input currents that correspond to a plurality of output frequencies of a current control oscillator, and to switch the frequencies of the current control oscillator by switching these currents.

A fourth invention for solving the above-mentioned tasks, which is a synthesizer, is characterized in having: a divider for dividing a frequency of an input; a phase detector and a charge pump circuit for injecting an electric charge, or pulling it out responding to a frequency difference of an input; a low-pass filter for converting said electric charge into a voltage; a voltage/current converter for converting said voltage into a current of a current control oscillator; a current control oscillator for changing an output frequency for said input current; a current holding circuit for holding an input current for a plurality of the output frequencies of the voltage control oscillator; and a switch for switching said low-pass filter and a holding current of the current holding circuit.

A fifth invention for solving the above-mentioned tasks, which is a synthesizer, is characterized in being configured so as to pre-hold input voltages that correspond to a plurality of output frequencies of a voltage control oscillator, and to control the voltage control oscillator with a feedback loop by switching these voltages, and to switch the frequency thereof.

A sixth invention for solving the above-mentioned tasks, which is a synthesizer, is characterized in having: a phase detector and a charge pump circuit for injecting an electric charge, or pulling it out responding to a frequency difference of an input; a plurality of low-pass filters for converting said electric charge into a voltage; a voltage control oscillator for changing an output frequency for said voltage; a divider for dividing a frequency of an input; and a switch for switching said low-pass filters.

A seventh invention for solving the above-mentioned tasks, which is a synthesizer, is characterized in switching a frequency characteristic of a band pass filter responding to a frequency of a spectrum of an output signal of a mixer.

An eighth invention for solving the above-mentioned tasks, which is a synthesizer, is characterized in having: a mixer for outputting a signal having a frequency of a difference between a frequency of a first input signal and a frequency of a second input signal, and a signal having a frequency of a sum of a frequency of a first input signal and a frequency of a second input signal; a switch for switching said frequency of said second input signal; and a band pass filter capable of switching a central frequency over to a frequency of the signal having the frequency of a difference between the frequency of the first input signal and the frequency of the second input signal, or a frequency of the signal having the frequency of a sum of the frequency of the first input signal and the frequency of the second input signal.

A ninth invention for solving the above-mentioned tasks, which is a synthesizer, is characterized in having: a mixer for outputting a signal having a frequency of a difference between a frequency of a first input signal and a frequency of a second input signal, and a signal having a frequency of a sum of a frequency of a first input signal and a frequency of a second input signal; a high-pass filter having a cut-off frequency characteristic with the frequency of the first input signal that is a fixed frequency; a low-pass filter having a cut-off frequency characteristic with the frequency of the first input signal that is a fixed frequency; a switch for switching said frequency of said second input signal; and a switch for switching an output signal of said high-pass filter, and an output signal of said low-pass filter.

A tenth invention for solving the above-mentioned tasks, which is a synthesizer, is characterized in having: a switch for selecting and outputting one of a plurality of signals; a mixer into which an input signal and an output signal of said switch are input, said mixer outputting a signal having a frequency of a difference between a frequency of said input signal and a frequency of said output signal of said switch, and a signal having a frequency of a sum of a frequency of said input signal and a frequency of said output signal of said switch; and a band pass filter capable of switching a central frequency over to a frequency of the signal having the frequency of a difference that is output from said mixer, or a frequency of the signal having the frequency of a sum, and allowing one of these signals to pass.

An eleventh invention for solving the above-mentioned tasks, which is a synthesizer, is characterized in generating an output clock signal by switching a plurality of multi-phase clock signals generated from an input clock signal at a constant phase partition period.

A twelfth invention for solving the above-mentioned tasks, which is a synthesizer, is characterized in having: a multi-phase generator for generating a multi-phase clock signal from an input clock signal; a circuit for selecting this multi-phase clock signal to generating an output clock signal; and a controller for generating a control signal for selecting said multi-phase clock signal:

A thirteen invention for solving the above-mentioned tasks is characterized in further having a divider for increasing a period of the input clock signal by a factor of a positive integer to output it to the multi-phase generator in the above-mentioned twelfth invention.

A fourteenth invention for solving the above-mentioned tasks is characterized in having a plurality of multi-phase generators and a selector, and a selector for selecting output clocks of theses circuits, and switching the multi-phase clock signals sequentially in the above-mentioned twelfth invention.

A fifteenth invention for solving the above-mentioned tasks is characterized in generating the output clock signal by changing a phase partition period in the above-mentioned twelfth invention.

A sixteenth invention for solving the above-mentioned tasks, which is a synthesizer, is characterized in that a control signal that operates at a cycle of an input clock signal causes a switchover to passing or interruption of the input clock signal to be made, or the phase to be switched, thereby generating a signal, and by calculating a plurality of these signals, another signal is generated.

A seventeenth invention for solving the above-mentioned tasks, which is a synthesizer, is characterized in having a plurality of pulse generators having a circuit for inputting a multi-phase clock signal to generate a clock signal that can be switched in a finer phase partition, an accumulator for generating a control signal at a cycle of said clock signal, and a gate circuit for making a switchover to passing or interruption of said clock signal with said control signal; and a circuit for calculating pulses to be output from said plurality of said pulse generators.

In accordance with the foregoing synthesizer of the present invention, the frequency of the output clock signal can be switched at a high speed.

Also, in accordance with the foregoing synthesizer of the present invention, the frequency of the output clock signal can be switched in a broad band.

Also, in accordance with the foregoing synthesizer of the present invention, the frequency of the output clock signal to be switched can be partitioned, or the period length of the output clock signal to be switched can be finely adjusted at a frequency equal to or less than the frequency of the input clock signal.

Also, in the synthesizer of the present invention, by internally housing an accumulator in each pulse generator, the output of the synthesizer is obtained by making a simple addition of the output of each pulse generator.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

The synthesizer of the present invention has a voltage holding circuit for holding the input voltages that correspond to a plurality of the output frequencies of the VCO, and a switch for switching these voltages and the output voltage of the low-pass filter. Employing such a configuration to switch the input voltage of the VCO without employing a feedback control allows an objective of the present invention to be accomplished.

Also, in the synthesizer of the present invention, switching the central frequency of the band pass filter allows an objective of the present invention to be accomplished.

Also, the synthesizer of the present invention has a circuit for generating the multi-phase clock signals from the input clock signal or a signal obtained by dividing this, a circuit for selecting these multi-phase signals to generate the output clock signal, and a circuit for generating a selection signal of these circuits. Employing such a configuration to partition the period of the input clock signal with a plurality of the multi-phase clock signals, and to utilize a resolution of this partition time allows an objective of the present invention to be accomplished.

Embodiment 1

An embodiment 1 of the present invention will be explained in details, by making a reference to the accompanied drawings.

Figure 1:
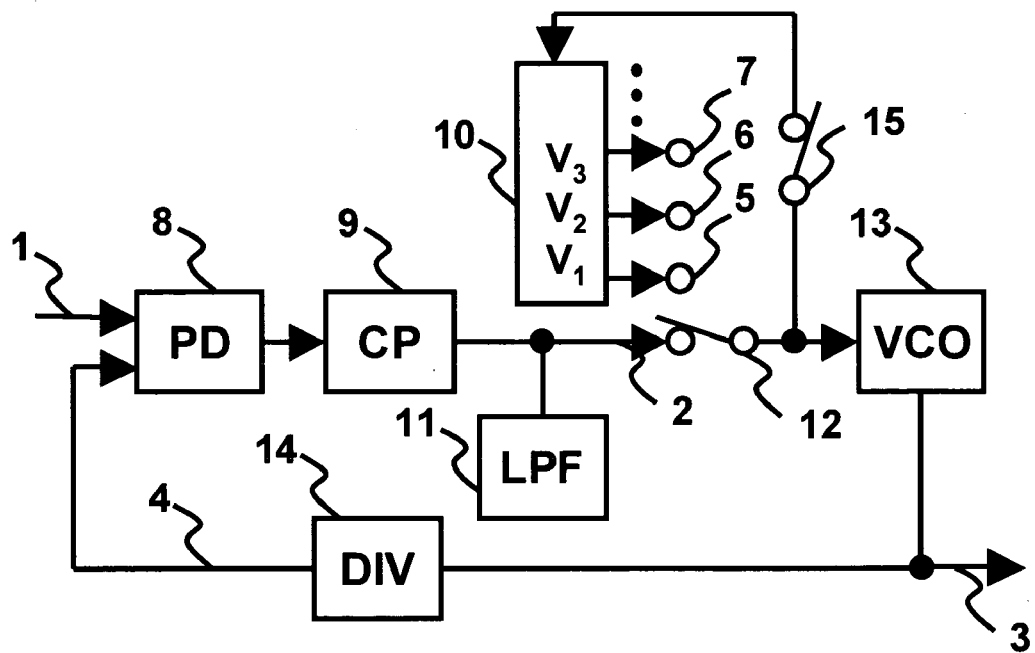
FIG. 1 is a block diagram of the synthesizer in the embodiment 1 of the present invention.

FIG. 1 is a block diagram illustrating the embodiment 1 of the present invention.

As shown in FIG. 1, the synthesizer of the embodiment 1 of the present invention has a phase detector 8 and a charge pump circuit 9 for injecting an electric charge, or pulling it out that corresponded to a frequency difference between an input clock signal 1 and an output signal 4 of the divider, a low-pass filter 11 for converting this electric charge into a voltage, a voltage control oscillator (VCO) 13 for changing an output frequency for this voltage, a divider 14 for dividing the frequency of the input, a voltage holding circuit 10 for holding the input voltage that corresponds to a plurality of output frequencies of the VCO 13, a low-pass filter 11, and a switch 12 for switching the holding voltage of the voltage holding circuit 10.

Next, a specific configuration of the voltage holding circuit 10 will be explained in details, by making a reference to the accompanied drawings.

Figure 2:
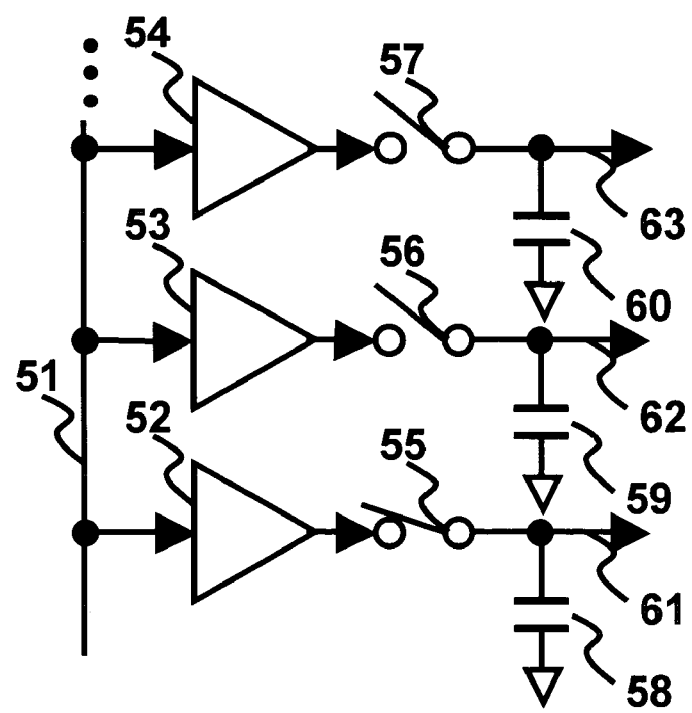
FIG. 2 is a block diagram illustrating the circuit configuration of the voltage holding circuit 10.

FIG. 2, which is a block diagram illustrating a circuit configuration of the voltage holding circuit 10, is a view having the voltage holding circuit 10 materialized.

As shown in FIG. 2, the voltage holding circuit 10 is configured of a first buffer 52 of which an input is a voltage 51 to be monitored, a second buffer 53, a third buffer 54, a first switch 55 for selecting the output signal of the buffer, a second switch 56, a third switch 57, a first capacity 58 for holding the output voltage of the buffer, a second capacity 59, and a third capacity 60.

Figure 3:
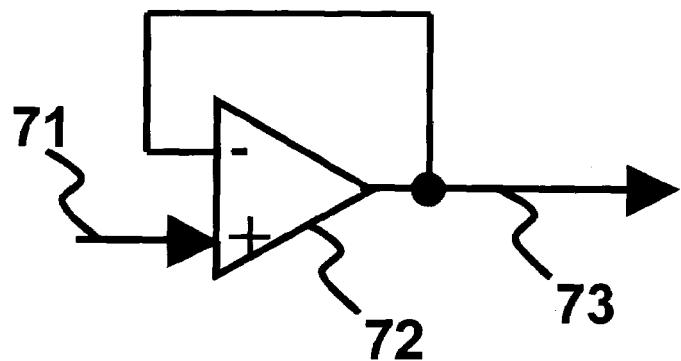
FIG. 3 is a specific circuit view of the buffers 52 to 54 to be employed for the voltage holding circuit 10 in the embodiment 1 of the present invention.

FIG. 3 is a specific circuit diagram of the buffers 52 to 54 to be employed for the voltage holding circuit 10 in the embodiment 1 of the present invention. As shown in FIG. 3, the buffers 52 to 54 are configured by connecting an input voltage 71 to a plus terminal of an operational amplifier 72, and an output voltage 73 to a minus terminal thereof respectively.

Next, an operation in the foregoing configuration will be explained in details, by making a reference to the accompanied drawings.

At first, in FIG. 1, by switching the switch 12 over to an output signal 2 of the low-pass filter 11, a loop of the phase detector 8, the charge pump circuit 9, the VOC 13, and the divider 14 is caused to operate. And, this loop is caused to operate until the frequency of the output clock signal is stabilized. At this moment, an output signal 2 of the low-pass filter 11 is input into the voltage holding circuit 10 by switching on a switch 15. At this moment, for example, by switching on the first switch 55, a signal (monitor voltage 51) input into the voltage holding circuit 10 is input into the first buffer 52, and a first holding voltage 61 that becomes a function of the monitor voltage 51 is held in the first capacity 58.

Next, in FIG. 1, by changing the frequency of the input clock signal 1, or a frequency dividing rate of the divider 14, the voltage holding circuit 10 is stabilized with the frequency of the different output clock signal. At this moment, in the voltage holding circuit 10, in FIG. 2, by switching off the first switch 55, and switching on the second switch 56, a holding voltage 62 is held in the second capacity 59.

By repeating these operations, the voltage that corresponded to the frequency of the VCO 13 is held in each capacity of the voltage holding circuit 10. The operation of the voltage supply to the capacities 58, 59, and 60 mentioned above is carried out when a transmitter or receiver using this embodiment interrupted a transmission/reception operation. At the time of the transmission/reception operation, the switch 12 is switched over to each holding voltage, which is assumed to be an input voltage of the VCO 13, thereby switching the frequency of the output clock signal 3. At this moment, the switch 15 is off.

In FIG. 2, it is preferable that the buffers 52 to 54 output the voltage identical to the monitor voltage 51, and yet the voltage is held in the capacities 58 to 60. This is because when a difference exists between the monitor voltage 51 and the output voltage of the buffer, the frequency of the output clock signal 3 differs between in a case where the monitor voltage 51 was assumed to be an input voltage of the VCO 13 and in a case where the holding voltage of the capacities 58 to 60 to be an input voltage of the VCO 13.

Also, it is preferable that an input impedance of the buffer is large. This is because the monitor voltage 51 fluctuates when the input impedance is small.

Next, an application example of the synthesizer of the present invention will be explained.

In the synthesizer of the present invention, holding the voltage that corresponded to a plurality of the output frequencies of the VCO 13 to switch this voltage makes it possible to switch the frequency at a high speed.

Such an application example of the synthesizer of the present invention will be explained, by making a reference to the accompanied drawings.

Figure 4:
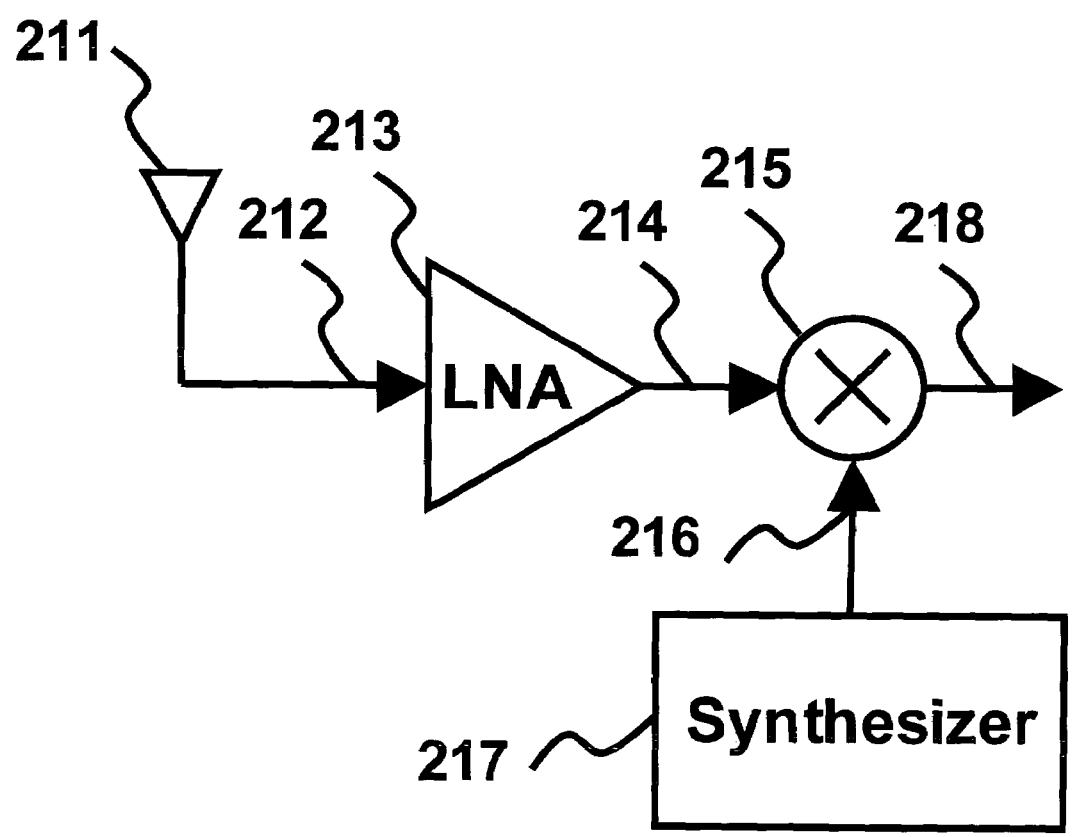
FIG. 4 is a view illustrating an application example of the synthesizer of the present invention.

FIG. 4 is a view illustrating an application example of the synthesizer of the present invention. A synthesizer 217 of the present invention is effective in a wireless system for making a frequency hopping as shown in FIG. 4.

In FIG. 4, an antenna output signal 212 via an antenna 211 is amplified by a low noise amplifier (LNA) 213, a mixer output signal 218 is generated by a mixer 215 with this LNA output signal 214, and an output clock signal 216 of the synthesizer 217 assumed to be an input respectively.

Next, an operation of this synthesizer 217 will be explained, by making a reference to the accompanied drawings.

Figure 5:
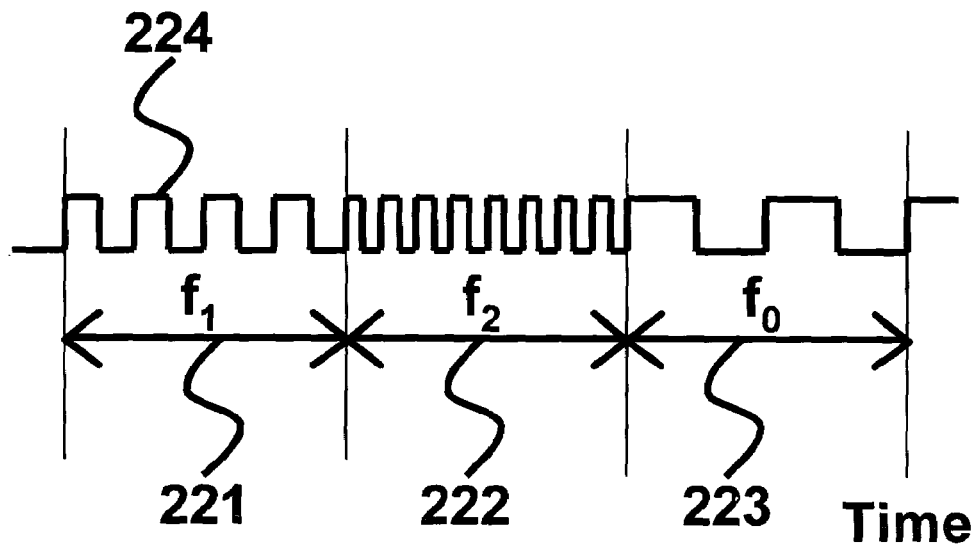
FIG. 5 is a view in which the operation of the synthesizer was specifically illustrated.

FIG. 5 is a view in which the operation of the synthesizer was specifically illustrated. As shown in FIG. 5, the frequency of a output clock signal 224 of the synthesizer 217 is switched over to a first frequency 221, a second frequency 222, and a third frequency 223. At this moment, the frequency of the clock signal was 1 GHz or more, and a switchover time period was 20 ns or less.

Embodiment 2

An embodiment 2 of the present invention will be explained in details, by making a reference to the accompanied drawings.

Figure 6:
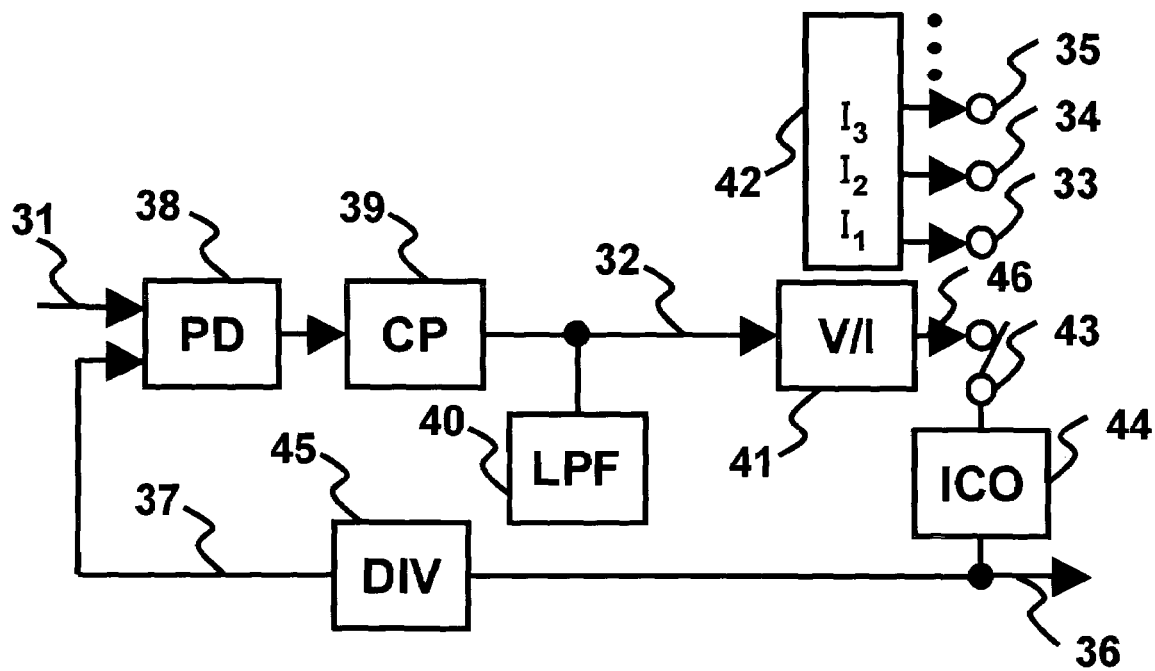
FIG. 6 is a block diagram illustrating the synthesizer in the embodiment 2 of the present invention.

FIG. 6 is a block diagram illustrating the synthesizer in the embodiment 2 of the present invention.

As shown in FIG. 6, as compared with the embodiment 1, the synthesizer of the embodiment 2 differs in having a current control oscillator 44 instead of the VCO 13, a current holding circuit 42 instead of the voltage holding circuit 10, and further a voltage/current converter 41 for converting the output signal of the low-pass filter into a current. Additionally, a phase detector 38, a charge pump circuit 39, a low-pass filter 40, and a divider 45 have a configuration similar to the phase detector 8, the charge pump circuit 9, the low-pass filter 11, and the divider 14 in the embodiment 1, whereby detailed explanation thereof is omitted.

Next, the operation of the embodiment 2 will be explained, by making a reference to the accompanied drawings.

As shown in FIG. 6, as compared with the embodiment 1, the currents that correspond to a plurality of the output frequencies of the current control oscillator 44 are held in the current holding circuit 42. The current to be held by the current holding circuit 42 at this moment is a current obtained by copying an output current 46 of the voltage/current converter 41 after the frequency of an output clock signal 31 was stabilized with a loop including the low-pass filter 40 similarly to the embodiment 1. For example, if it is assumed that this holding current is a first holding current 33, a second holding current 34, and a third holding current 35, the frequency of the output clock signal 36 is switched by making a switchover to these holding currents with the switch 43.

In accordance with this embodiment, holding the current that corresponded to a plurality of the output frequencies of the current control oscillator to switch this current makes it possible to switch the frequency at a high speed also in a case where not the VCO but the current control oscillator was employed.

Embodiment 3

An embodiment 3 of the present invention will be explained in details, by making a reference to the accompanied drawings.

Figure 7:
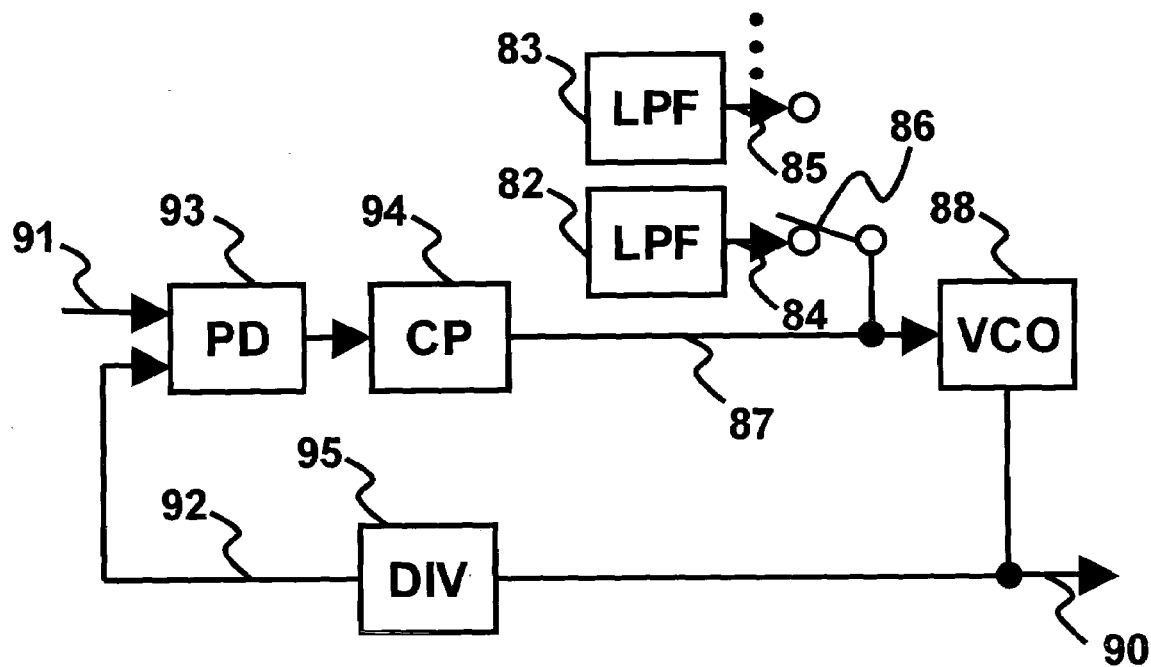
FIG. 7 is a block diagram illustrating the circuit configuration of the embodiment 3 of the present invention.

FIG. 7 is a block diagram illustrating a circuit configuration of the embodiment 3 of the present invention.

As shown in FIG. 7, as compared with the embodiment 1, the embodiment 3 differs in having no holding voltage circuit 10, and having a first low-pass filter 82 and a second low-pass filter 83, and a switch 86 for switching these. The number of the low-pass filter may be plural.

Additionally, a phase detector 93, a charge pump circuit 94, a VCO 88, and a divider 95 have a configuration similar to the phase detector 8, the charge pump circuit 9, the VCO 13, and the divider 14 in the embodiment 1, whereby detailed explanation thereof is omitted.

Next, the operation of this embodiment will be explained, by making a reference to the accompanied drawings.

As shown in FIG. 7, by making a switchover between the low-pass filters 82 and 83 with the switch 86, the voltages that correspond to a plurality of the output frequencies of the voltage control oscillator 88 are held in the low-pass filters 82 and 83. For example, by switching the switch 86, an output signal 84 of the first low-pass filter 82 and an input signal 87 of the VCO 88 are connected to keep its operation until the frequency of an output clock signal 90 comes into a stationary state.

Next, the frequency of the output clock signal 90 is switched by switching the frequency of an input clock signal 91 or the frequency dividing rate of the divider 95, and by switching the switch 86, an output signal 85 of the second low-pass filter 83 and the input signal 87 of the VCO 88 are connected to keep its operation until the frequency of the output clock signal 90 comes into a stationary state.

After the voltage to the low-pass filter was held in such a manner, the frequency of the output clock signal 90 is switched by switching the switch 86. At this moment, simultaneously therewith, the frequency of the input clock signal 91 for generating the frequency of the output clock signal 90 that is identical at the time that the voltage to the low-pass filter was held, or the frequency dividing rate of the divider 95 is switched.

As mentioned above, in accordance with the embodiment 3, causing a plurality of the low-pass filters to hold the voltages that corresponded to a plurality of the output frequencies of the voltage control oscillator, and by switching these low-pass filters make it possible to switch the frequency at a high speed, and further to perform an operation with a feedback control.

Embodiment 4

An embodiment 4 of the present invention will be explained in details, by making a reference to the accompanied drawings.

Figure 8:
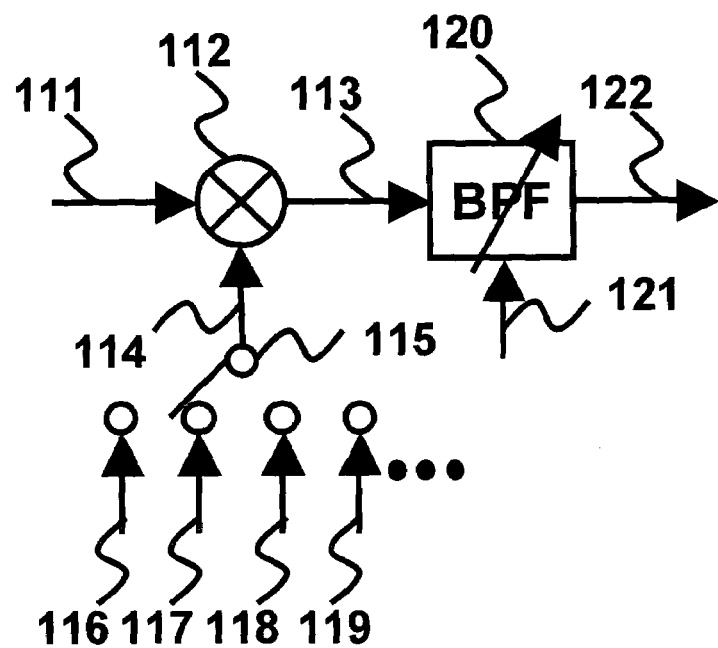
FIG. 8 is a block diagram of the synthesizer in the embodiment 4 of the present invention.

FIG. 8 is a diagram block of the embodiment 4 of the present invention.

As shown in FIG. 8, the synthesizer of the embodiment 4 is configured of a mixer 112, a switch 115 for switching a second input signal 116, a third input signal 117, a fourth input signal 118, and a fifth input signal 119, and a band pass filter 120. Additionally, the number of the signal to be input into the switch 115 may be plural except four. Also, the number of a first input signal 111 may be plural.

In FIG. 8, in a case where the switch 115 selects the second input signal 116, an output signal 114 of the switch becomes the second input signal 116, and the mixer 112 outputs a signal having the frequency of a sum of the frequency of the first input signal 111 and the frequency of the second input signal 116, and a signal having the frequency of a difference between the frequency of the first input signal 111 and the frequency of the second input signal 116.

At this moment, a control signal 121 of the band pass filter 120 causes the central frequency of the band pass filter 120 to be switched over to a frequency of the signal having the frequency of a sum of the frequency of the first input signal 111 and the frequency of the second input signal 116, or a frequency of the signal having the frequency of difference between the frequency of the first input signal 111 and the frequency of the second input signal 116.

Figure 9:
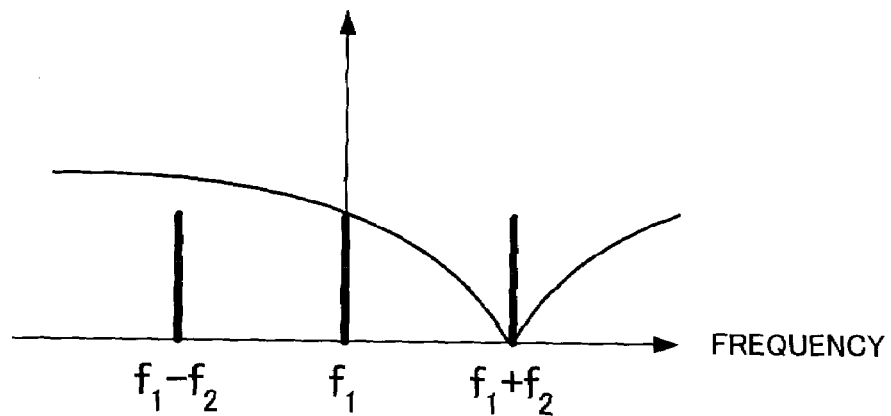
FIG. 9 is a view for explaining the band pass filter 120.

This causes the signal other than the signal having the central frequency of the band pass filter 120 to be removed, and the signal having the frequency of a sum of the frequency of the first input signal 111 and the frequency of the second input signal 116, or the signal having the frequency of a difference between the frequency of the first input signal 111 and the frequency of the second input signal 116 to be output. This situation is shown in FIG. 9. In FIG. 9, the situation is shown in which the signal having the frequency of a sum of the frequency of the first input signal 111 and the frequency of the second input signal 116 is output, with the frequency of the first input signal 111 assumed to be $f_1$, the frequency of the second input signal 116 to be $f_2$, and the central frequency of the band pass filter 120 to be $f_1+f_2$.

Next, in a case where the switch 115 selects the third input signal 117, the control signal 121 of the band pass filter causes the central frequency of the band pass filter 120 to be switched over to a frequency of the signal having the frequency of a sum of the frequency of the first input signal 111 and the frequency of the third input signal 117, or a frequency of the signal having the frequency of a difference between the frequency of the first input signal 111 and the frequency of the third input signal 117.

This causes a signal having the frequency of a sum of the frequency of the first input signal 111 and the frequency of the third input signal 117, or a signal having the frequency of a difference between the frequency of the first input signal 111 and the frequency of the third input signal 117 to be output.

As mentioned above, by switching the central frequency of the band pass filter 120 according to the frequency of the output signal of the mixer 112, the frequency of the output signal is switched in a broad band.

Next, an application example of the foregoing synthesizer will be explained.

Figure 10:
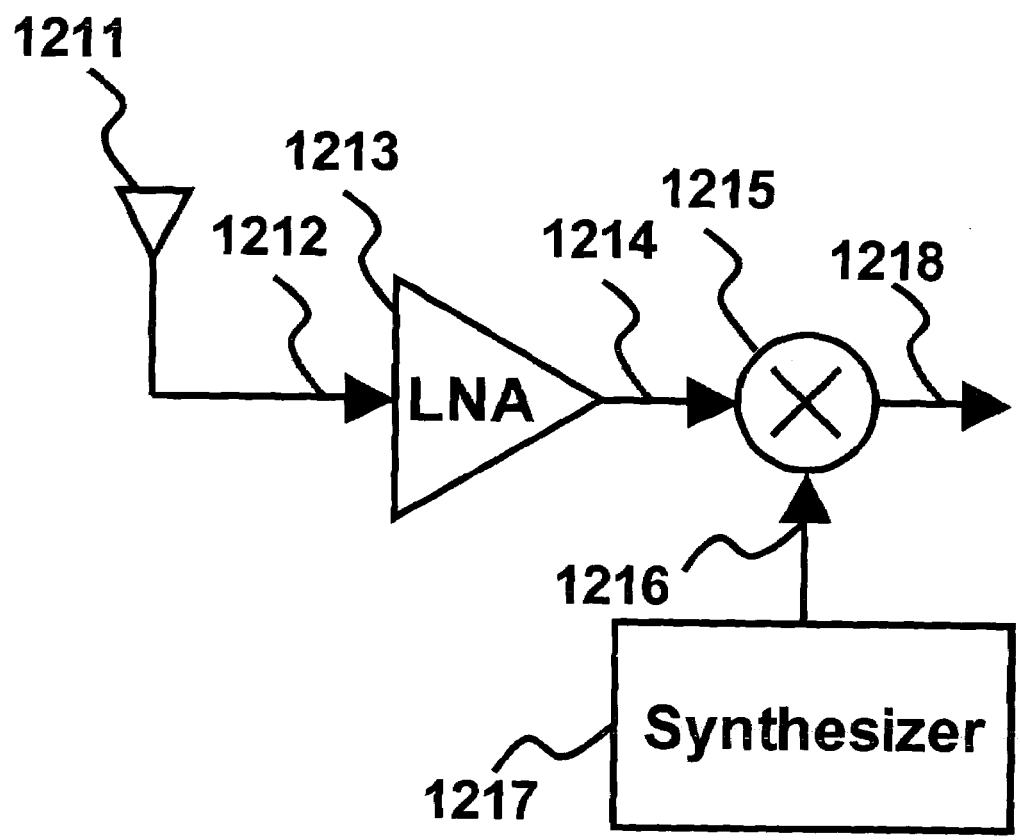
FIG. 10 is a view illustrating an application example of the synthesizer.

FIG. 10 is a view illustrating an application example of the foregoing synthesizer.

A synthesizer 1217 of the present invention is effective in a wireless system for making a frequency hopping as shown in FIG. 10.

In FIG. 10, an antenna output signal 1212 via an antenna 1211 is amplified by a low noise amplifier (LNA) 1213, and a mixer output signal 1218 is generated by a mixer 1215 with this LNA output signal 1214 and an output clock signal 1216 of the synthesizer assumed to be an input respectively.

Embodiment 5

An embodiment 5 of the present invention will be explained in details, by making a reference to the accompanied drawings.

Figure 11:
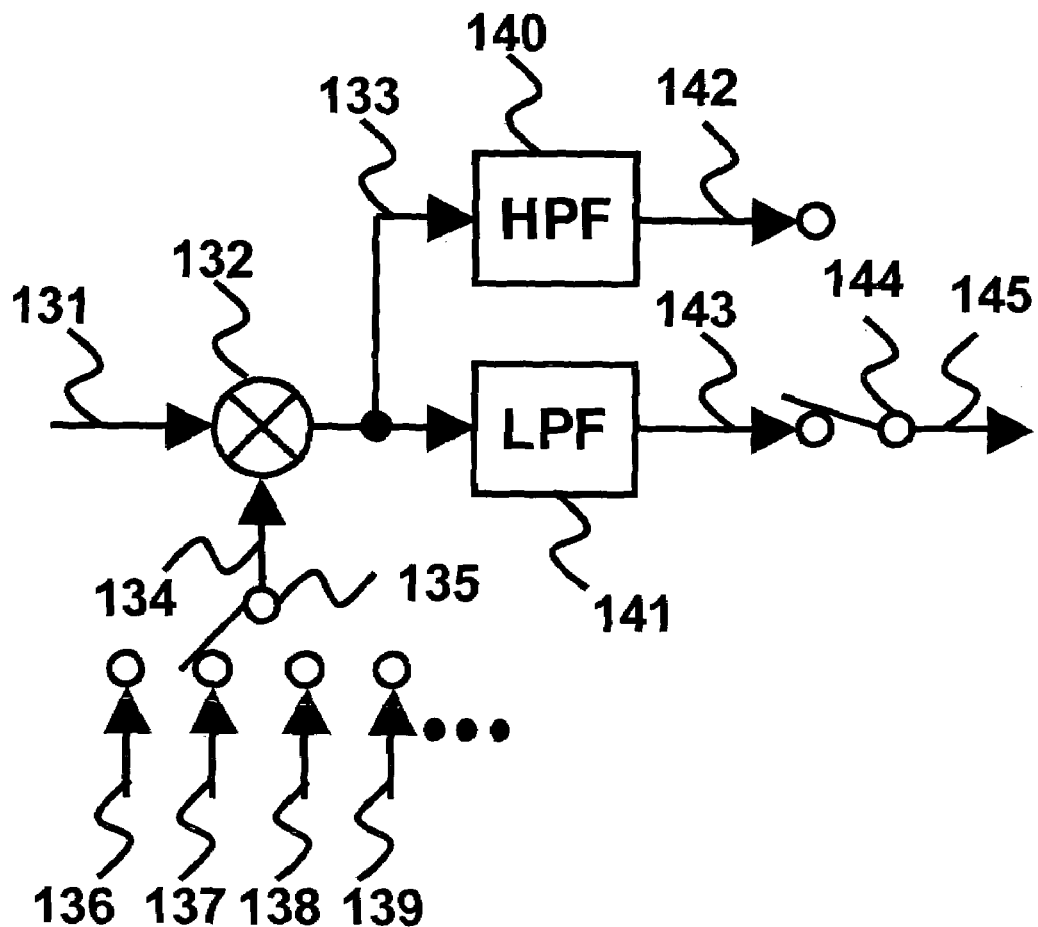
FIG. 11 is a block diagram of the synthesizer in the embodiment 5 of the present invention.

FIG. 11 is a diagram block of the synthesizer in the embodiment 5 of the present invention.

As shown in FIG. 11, as compared with the embodiment 4, the synthesizer of the embodiment 5 differs in having a low-pass filter 141 and a high-pass filter 140 instead of the band pass filter 120, and a switch 144 for making a switchover between an output signal 143 of the low-pass filter 141 and an output signal 142 of the high-pass filter 140.

Next, the operation of the embodiment 5 will be explained, by making a reference to the accompanied drawings.

In FIG. 11, for example, in a case where a switch 135 selects a second input signal 136, an output signal 134 of the switch becomes the second input signal 136, and a first input signal 131 and the second input signal 136 are input into to a mixer 132. And the mixer 132 outputs a signal having the frequency of a sum of the frequency of the first input signal 131 and the frequency of the second input signal 136, and a signal having the frequency of a difference between the frequency of the first input signal 131 and the frequency of the second input signal 136.

Figure 12:
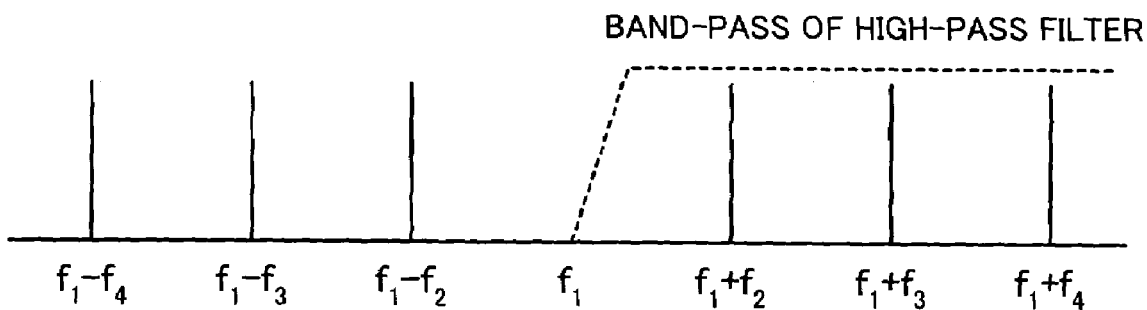
FIG. 12 is a view for explaining the high-pass filter 140.

At this moment, let the cut-off frequency of the high-pass filter 140 be defined as a frequency of the first input signal 131. This cause the output signal 142 of the high-pass filter 140 to become a signal having the frequency of a sum of the frequency of the first input signal 131 and the frequency of the second input signal 136. This situation is shown in FIG. 12. It is shown in FIG. 12 that let the frequency of the first input signal 131 be defined as $f_1$, and the frequency of the second input signal 136 as $f_2$, it follows that a signal that passes is a signal having the frequency of a sum of the frequency of the first input signal 131 and the frequency of the second input signal 136.

Figure 13:
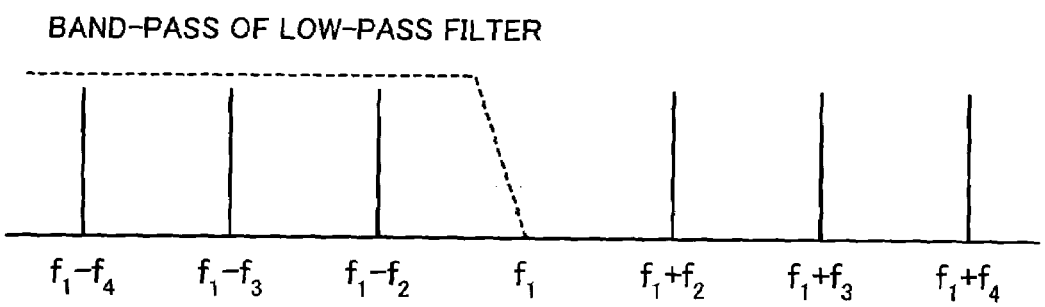
FIG. 13 is a view for explaining the low-pass filter 141.

Also, let the cut-off frequency of the low-pass filter 141 be defined as the first input signal 131. This causes a low-pass filter output signal 143 to become a signal having the frequency of a difference between the frequency of the first input signal 131 and the frequency of the second input signal 136. This situation is shown in FIG. 13. It is shown in FIG. 13 that let the frequency of the first input signal 131 be defined as $f_1$, and the frequency of the second input signal 136 as $f_2$, it follows that a signal that passes is a signal having the frequency of a difference of the frequency of the first input signal 131 and the frequency of the second input signal 136.

A switchover between the output signal 142 of the high-pass filter 140 and the output signal 143 of the low-pass filter 141 is made with a switch 144 to obtain an output signal 145.

Further, a third input signal 137, a fourth input signal 138, or a fifth input signal 139 is input into the mixer 132 by switching the switch 135 to obtain the output signal 145 having each frequency.

In accordance with this embodiment, setting the cut-off frequencies of the low-pass filter and the high-pass filter to the frequency of a signal having a fixed frequency out of two input signals of the mixer to select the outputs of the low-pass filter and the high-pass filter makes it possible to reduce a circuit scale of the filter, and to switch the frequency of the output signal in a broad band.

Embodiment 6

Next, an embodiment 6 of the present invention will be explained in details, by making a reference to the accompanied drawings.

Figure 14:
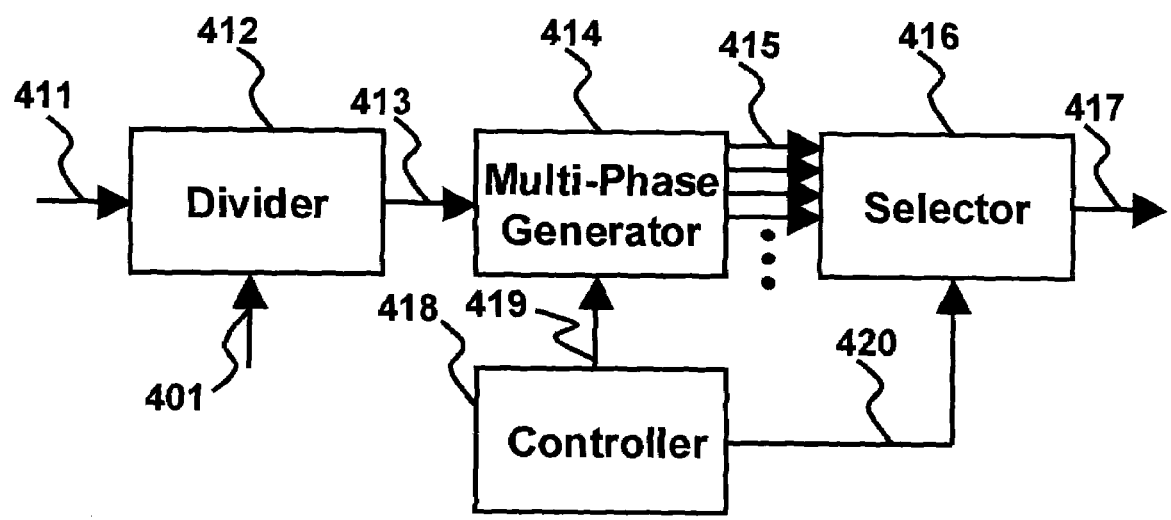
FIG. 14 is a block diagram of the synthesizer in the embodiment 6 of the present invention.

FIG. 14 is a diagram block of the synthesizer in the embodiment 6 of the present invention.

As shown in FIG. 14, the synthesizer of the embodiment 6 includes a divider 412 for increasing the period of an input clock signal 411 by a factor of a positive integer, a multi-phase generator 414 for generating multi-phase clock signals from this divider output signal 413, and a selector 416 for selecting and generating an output clock signal 417 from among a plurality of these multi-phase clock signals 415, and a controller 418 for generating control signals of the multi-phase generator 414 and the selector 416 (a control signal 420 of the multi-phase generator, and a control signal 421 of the selector).

Next, a specific configuration of each circuit block will be explained.

In FIG. 14, the divider 412 switches the period of the input clock signal 411 over to a period obtained by increasing it by a factor of an integral with the control signal 401, and generates the divider output signal 413.

Figure 15:
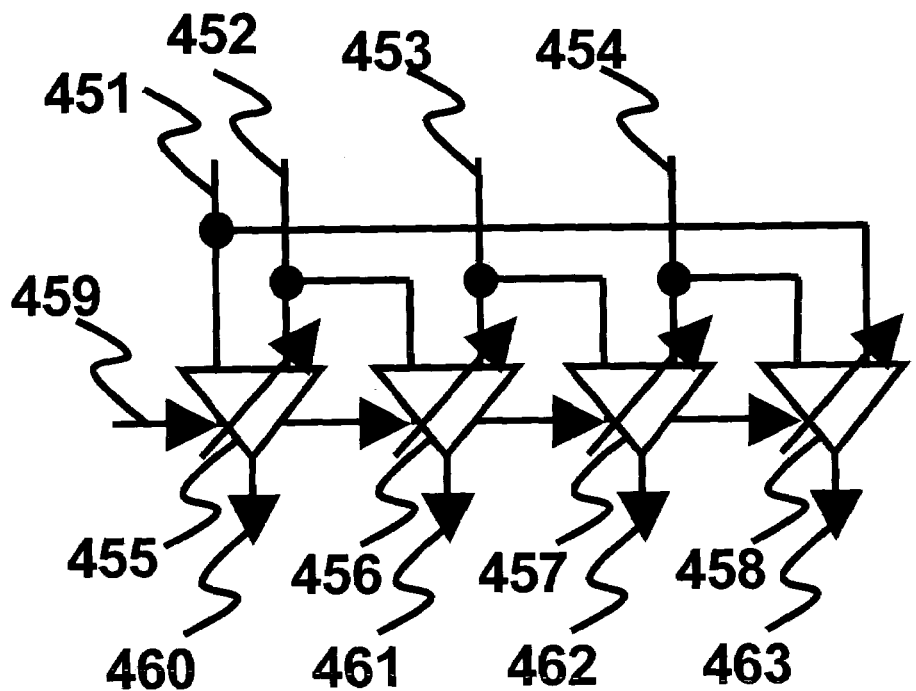
FIG. 15 is a view having the multi-phase generator materialized.

FIG. 15, which is a block diagram illustrating a circuit configuration of the embodiment 6, is a view having the multi-phase generator materialized.

As shown in FIG. 15, the multi-phase generator 414 includes a phase interpolator 455 for generating a signal having a phase of 0° to 90° with a signal 451 having a phase of 0° and a signal 452 having a phase of 90° assumed to be an input respectively, a phase interpolator 456 for generating a signal having a phase of 90° to 180° with the signal 452 having a phase of 90° and a signal 453 having a phase of 180° assumed to be an input respectively, a phase interpolator 457 for generating a signal having a phase of 180° to 270° with the signal 453 having a phase of 180° and a signal 454 having a phase of 270° assumed to be an input respectively, and a phase interpolator 458 for generating a signal having a phase of 270° to 360° (0°) with the signal 454 having a phase of 270° and the signal 451 having a phase of 360° (0°) assumed to be an input respectively.

At this moment, the signal 451 having a phase of 0°, the signal 452 having a phase of 90°, the signal 453 having a phase of 180°, and the signal 454 having a phase of 270° are generated with the phases shifted by 90°, 180°, and 270° from the divider output signal 413 respectively. Also, these signals 451, 452, 453, and 454 can be generated in the divider 412 as well. Also, a control signal 459 of the phase interpolator causes the output phase of each phase interpolator to be switched.

Figure 16:
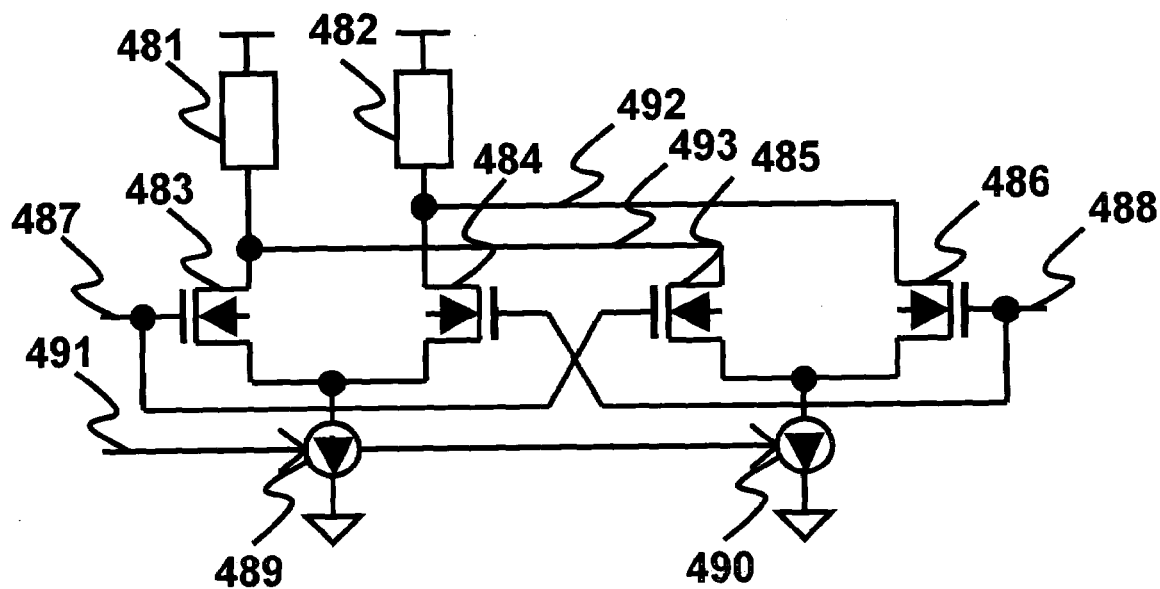
FIG. 16 is a view having the phase interpolator materialized that is employed for the multi-phase generator.

FIG. 16 is a view having the phase interpolator materialized that is employed for the multi-phase generator.

As shown in FIG. 16, in the phase interpolator, a first load circuit 481 is connected to drain ends of a first MOS transistor 483 and a third MOS transistor 485, a second load circuit 482 to drain ends of a second MOS transistor 484 and a fourth MOS transistor 486, a first current source 489 to source ends of the first MOS transistor 483 and the second MOS transistor 484, a second current source 490 to source ends of the third MOS transistor 485 and the fourth MOS transistor 486, a first input signal 487 to gate ends of the first MOS transistor 483 and the third MOS transistor 485, and a second input signal 488 to gate ends of the second MOS transistor 484 and the fourth MOS transistor 486 to output a first output signal 492 and a second output signal 493. At this moment, a control signal 491 of a current source causes the current capacities of the first current source 489 and the second current source 490 to be controlled, and the phase of the output signal to be switched.

In addition hereto, the phase interpolator can be configured also by connecting the outputs of two CMOS inverters to control a driving ability of each inverter. Also, in FIG. 14, a four-phase cock signal was input; however it can be configured also by employing a clock signal of which the phase number is four or more.

In addition hereto, the multi-phase generator can be configured also by connecting a plurality of delay circuits in series to fetch the output of each delay circuit.

In FIG. 14, the selector 416 selects and outputs a clock signal having one phase from among the multi-phase clock signals that are input in plural with the control signal 420. At this moment, the value of the output clock signal 417 is inverted, being synchronized with the selected clock signal.

In FIG. 14, the controller 418 of the multi-phase generator and the selector switches the control signal, being synchronized with the output clock signal 417, or at a non-synchronous timing.

Next, the operation of the foregoing embodiment will be explained in details, by making a reference to the accompanied drawings.

Figure 17:
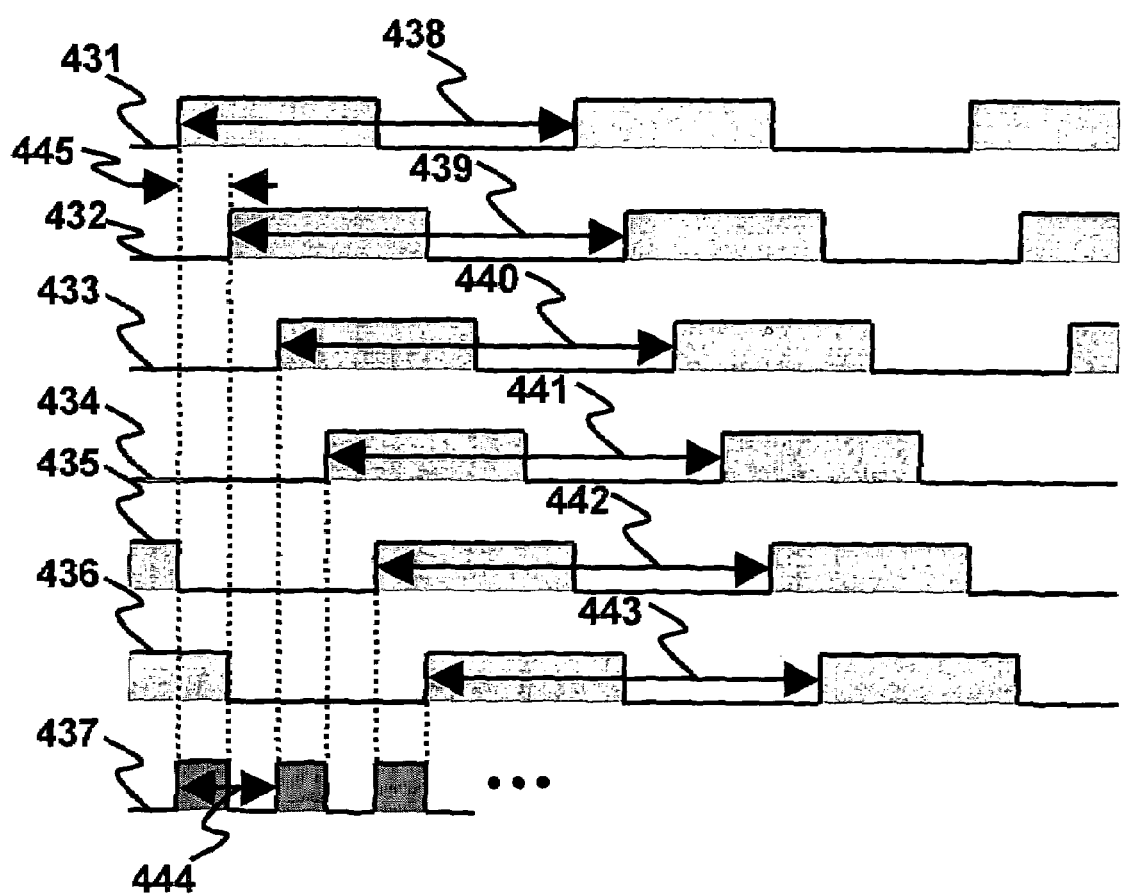
FIG. 17 is a view illustrating the operation of the embodiment 6.

FIG. 17 is a view illustrating the operation of this embodiment.

As shown in FIG. 17, a leading edge of an input clock signal 431 causes the value of an output clock signal 437 to be inversed from a low level to a high level. Next, the multi-phase generator 414 generates a signal 432 having the input clock signal delayed by one partition, and this leading edge causes the output clock signal 437 to be inversed from a high level to a low level. At this moment, a one-partition delay time 445 is a least delay time in which the multi-phase generator 414 can be switched.

Further, signals are generated having the input clock signal delayed one partition by one partition such as a signal 433 having the input clock signal delayed by two partitions, a signal 434 having the input clock signal delayed by three partitions, a signal 435 having the input clock signal delayed by four partitions, and a signal 436 having the input clock signal delayed by five partitions, and each leading edge causes the output clock signal 437 to be inversed.

By repeating this operation, the output clock signal 437 having a period 444 identical to the delay time of two partitions is obtained.

Figure 18:
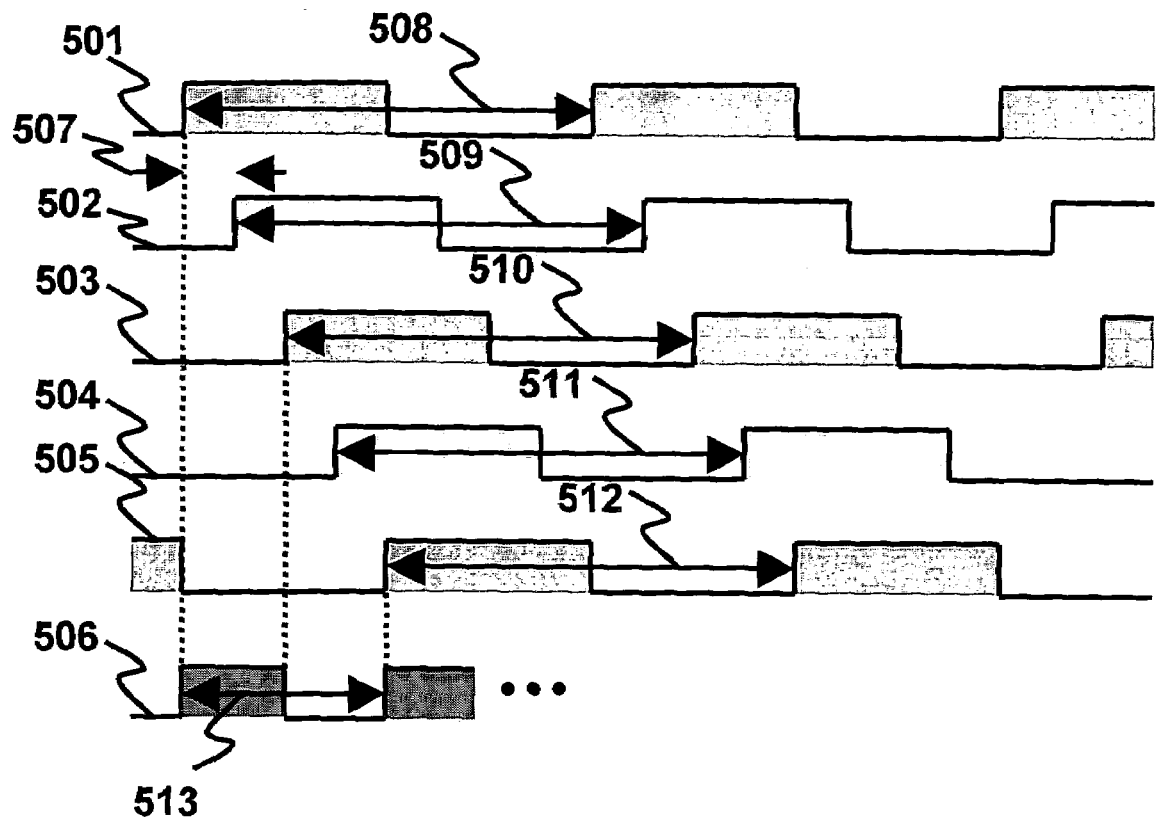
FIG. 18 is a view illustrating another operation of the embodiment 6.

FIG. 18 is a view illustrating another operation of this embodiment.

As shown in FIG. 18, after an output clock signal 506 was inversed from a low level to a high level with the leading edge of the input clock signal 501, differently from the operation shown in FIG. 17, not a signal 502 having the input clock signal delayed by one partition, but a signal 503 having the input clock signal delayed by two partitions is generated, and this leading edge causes the output clock signal 506 to be inversed from a high level to a low level.

Also, not a signal 504 having the input clock signal delayed by three partitions, but a signal 505 having the input clock signal delayed by four partitions is generated, and this leading edge causes the output clock signal 506 to be inversed from a high level to a low level. By repeating this operation of delaying the clock signal by two partitions to inverse the output clock operation, the output clock signal 506 having a period 513 identical to the delay time of four partitions is obtained. However, assume that this delay time of one partition 507 is identical to the delay time 445 in FIG. 17.

Next, an operation of the controller 418 of the multi-phase generator and the selector in FIG. 14 will be explained in details, by making a reference to the accompanied drawings.

Figure 19:
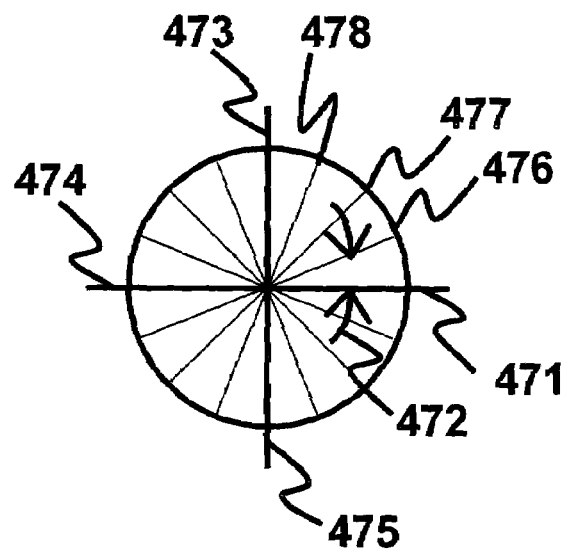
FIG. 19 is a view having the operation of the control signal materialized.

FIG. 19 is a view having the operation of the control signal materialized.

As shown in FIG. 19, let a control signal 471 for generating the clock signal having a phase 0° be defined as a binary four-bit signal "0000", it follows that a control signal 476 for generating the clock signal having phase 22.5° having one-partition phase 472 increased from a phase 0° is "0001", a control signal 477 for generating the clock signal having a phase 45° is "0010", a control signal 478 for generating the clock signal having a phase 62.5° is "0011", a control signal 473 for generating the clock signal having a phase 90° is "0100", further, a control signal 474 for generating the clock signal having a phase 180° is "1000", and a control signal 475 for generating the clock signal having a phase 270° is "1100".

In FIG. 15, when a high-order two-bit pattern of this control signal is "00", an output signal 460 of the phase interpolator for generating a signal having a phase 0° to 90° is selected, when it is "01", an output signal 461 of the phase interpolator for generating a signal having a phase 90° to 180° is selected, when it is "10", an output signal 462 of the phase interpolator for generating a signal having a phase 180° to 270° is selected, and when it is "11", an output signal 463 of the phase interpolator for generating a signal having a phase 270° to 360° (0°) is selected.

Also, the low-order two-bit control signal decides a phase interpolation rate of the phase interpolator in FIG. 15. For example, in FIG. 19, the control signal 477 for generating the clock signal having a phase 45° is "0010", and this means in FIG. 15 that the clock signal having a phase 45° is generated by selecting the output signal 460 of the phase interpolator for generating a signal having a phase 0° to 90° with the high-order two-bit pattern "00" to let the low-order two-bit pattern "10" be defined as a control signal 459 of the phase interpolator.

Figure 20:
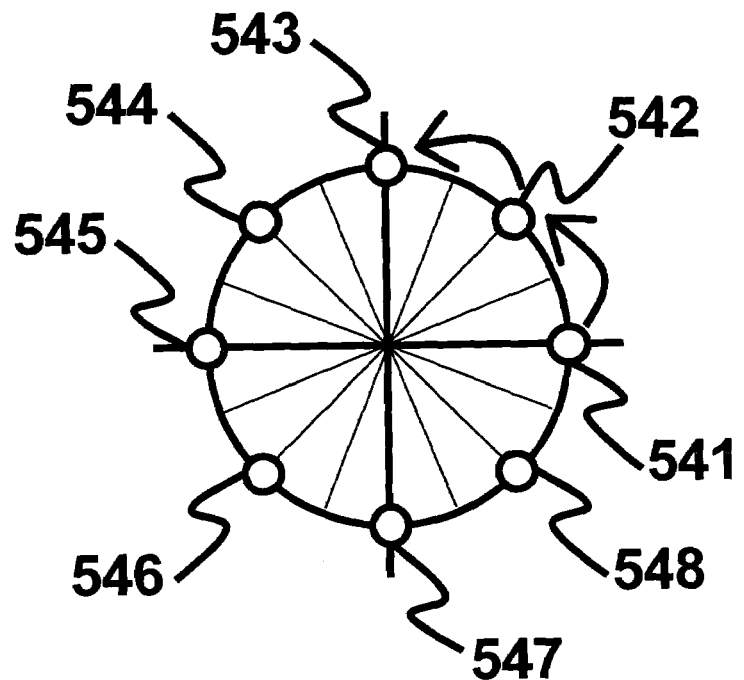
FIG. 20 is a view having another operation of the control signal in the embodiment 6 of the present invention materialized.

Also, FIG. 20 is a view having another operation of the control signal in the embodiment 6 of the present invention materialized.

Like FIG. 20, in a case of delaying the clock signal two partitions by two partitions to inverse the output clock signal 506, as shown in FIG. 20, the control signal is switched over to a second control signal 542 "0010" for delaying the clock signal by two partitions from a first control signal 541 "0000", to a third control signal 543 "0100" for delaying the clock signal by two partitions from the second control signal 542 "0010", further to a fourth control signal 544, to a fifth control signal 545, to a sixth control signal 546, to a seventh control signal 547, and to an eighth control signal 548 so as to delay the clock signal by two partitions respectively.

Next, the effect of this embodiment will be explained. In this embodiment, the multi-phase generator generates the clock signals at timing in the meantime of the period of the input clock signal, and by selecting these clock signals, the output clock signal is generated. For this, the period of the output clock signal can be adjusted at a resolution equal to or less than the period of the input clock signal.

Next, the effect of this embodiment will be explained, by making a reference to the accompanied drawings.

Figure 21:
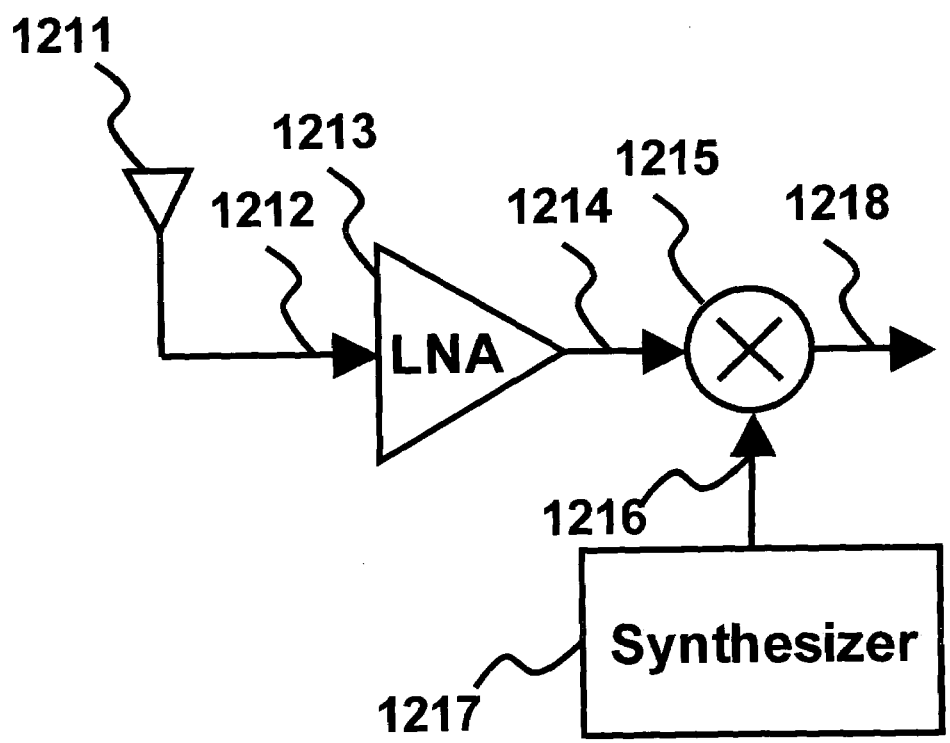
FIG. 21 is a block diagram illustrating the effect of the embodiment 6.

FIG. 21 is a diagram block illustrating the effect of the embodiment 6.

A synthesizer 1217 of the present invention as shown in FIG. 21 is effective in a wireless system for making a frequency hopping.

In FIG. 21, an antenna output signal 1212 via an antenna 1211 is amplified by a low noise amplifier (LNA) 1213, and a mixer output signal 1218 is generated by a mixer 1215 with this LNA output signal 1214 and an output clock signal 1216 of the synthesizer assumed to be an input respectively.

Next, an operation of this synthesizer 1217 will be explained in details, by making a reference to the accompanied drawings.

Figure 22:
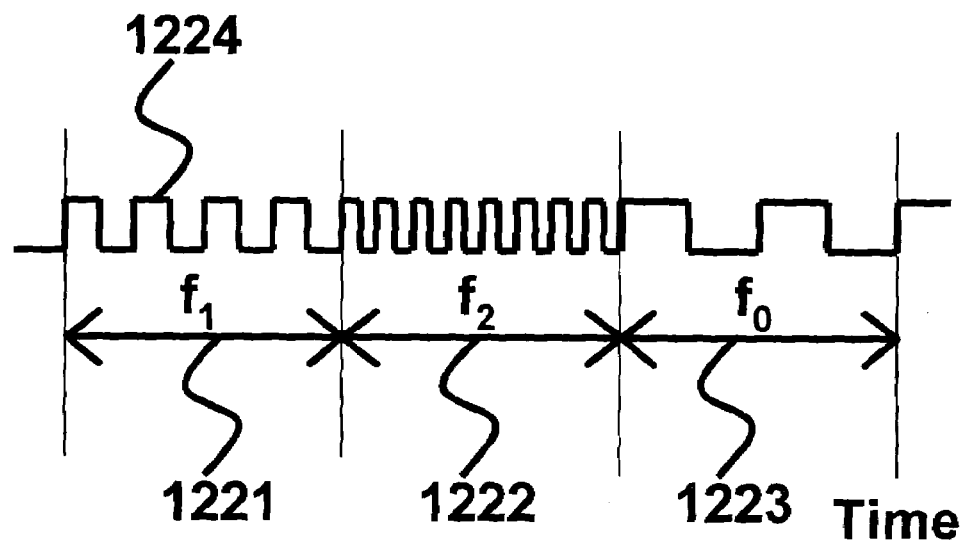
FIG. 22 is a view in which the operation of the synthesizer of the embodiment 6 was illustrated specifically.

FIG. 22 is a view in which the operation of the synthesizer was specifically illustrated.

As shown in FIG. 22, the frequency of an output clock signal 1224 of synthesizer is switched over to a first frequency 1221, a second frequency 1222, and a third frequency 1223 respectively.

Embodiment 7

Next, an embodiment 7 of the present invention will be explained in details, by making a reference to the accompanied drawings.

Figure 23:
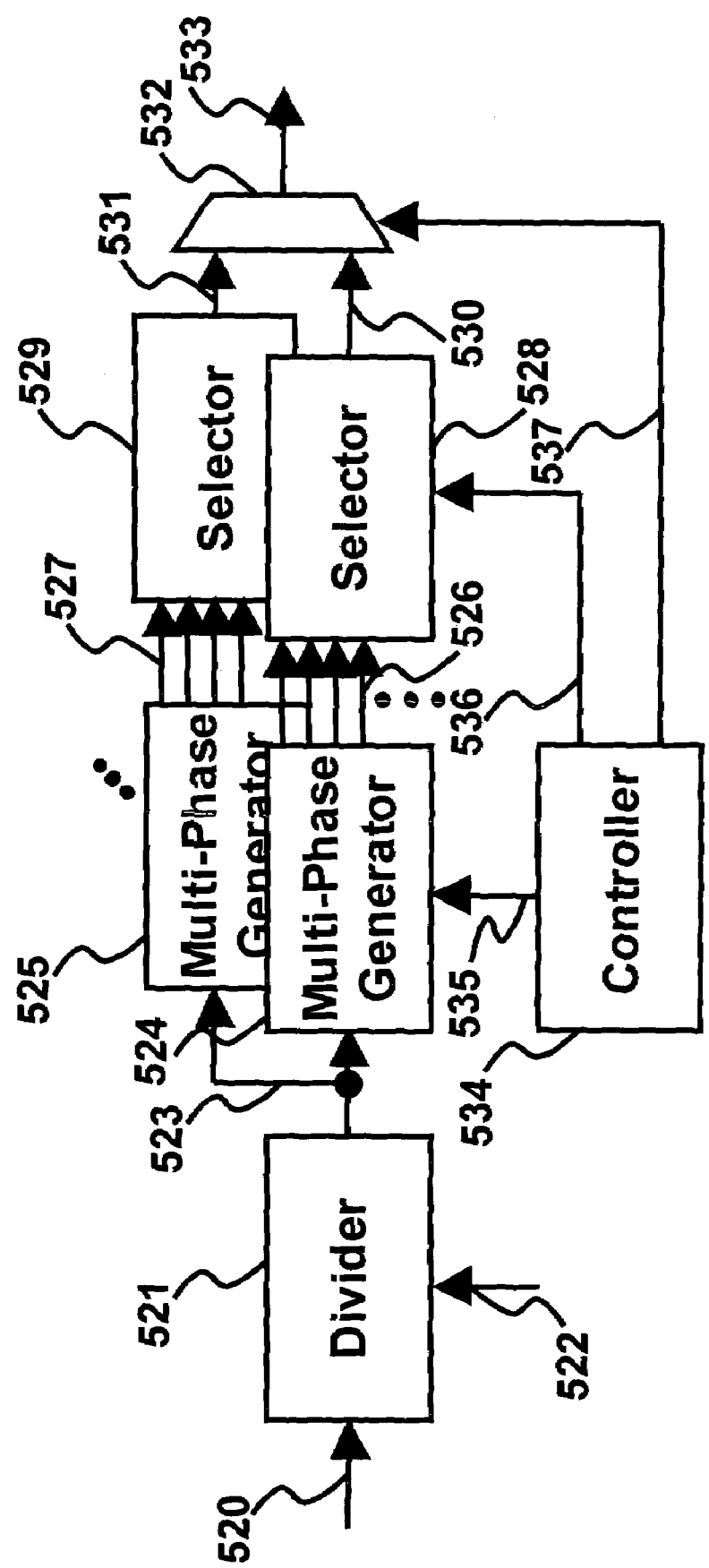
FIG. 23 is a block diagram of the synthesizer of the embodiment 7 of the present invention.

FIG. 23 is a block diagram of the synthesizer of the embodiment 7 of the present invention.

As shown in FIG. 23, as compared with the embodiment 6, the synthesizer of the embodiment 7 differs in having a first multi-phase generator 524 of which the input is an output signal 523 of the divider, a first selector 528, and a third selector 532 for connecting a second multi-phase generator 525 and a second selector 529 in parallel to select an output signal 530 of the first selector and an output signal 531 of the second selector.

Next, the operation of this embodiment will be explained, by making a reference to the accompanied drawings.

As shown in FIG. 23, when the third selector 532 has selected the output signal 530 of the first selector, the second multi-phase generator and the second selector generate the multi-phase clock signal, which is next selected by the third selector 532, with a control circuit 534.

The effect of this embodiment will be explained.

In this embodiment, controlling a pair of plural multi-phase generators and a selector sequentially makes it possible to lower an operation speed of the control circuit.

Embodiment 8

Next, an embodiment 8 of the present invention will be explained in details, by making a reference to the accompanied drawings.

Figure 24:
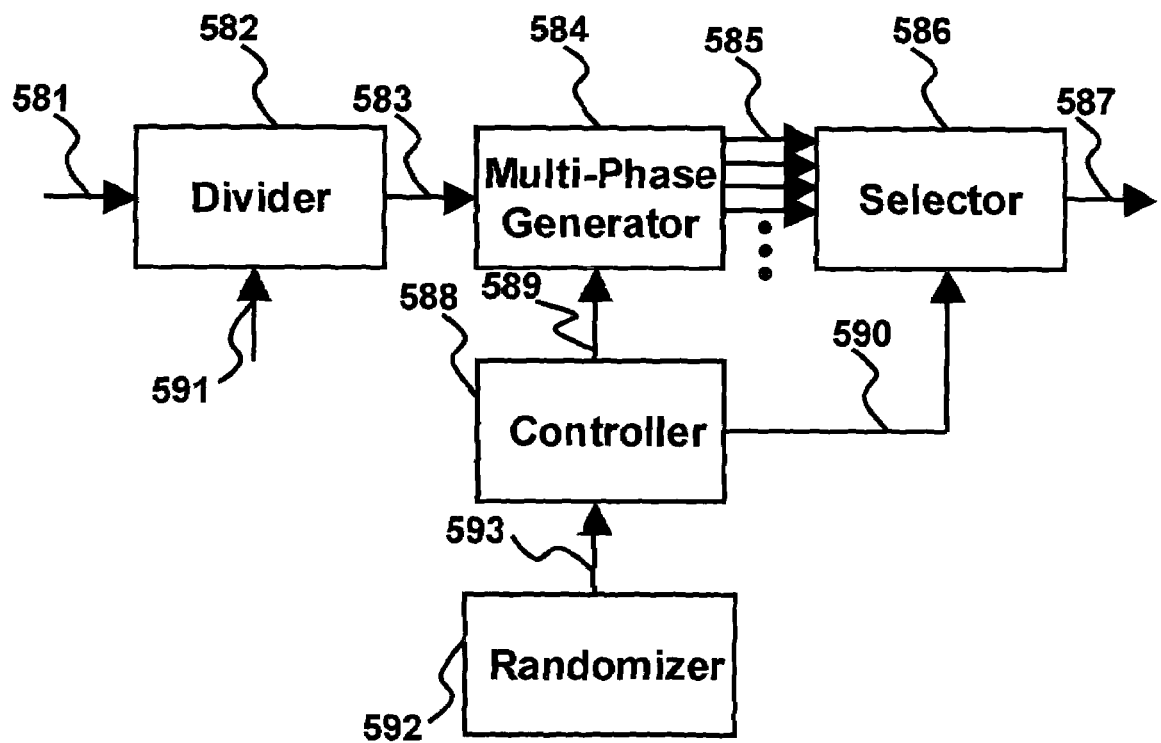
FIG. 24 is a block diagram of the synthesizer of the embodiment 8 of the present invention.

FIG. 24 is a block diagram of the synthesizer of the embodiment 8.

As shown in FIG. 24, the synthesizer of the embodiment 8 differs in having a randomizer 592 in addition to the embodiment 6.

Next, the operation of this embodiment will be explained in details, by making a reference to the accompanied drawings.

Figure 25:
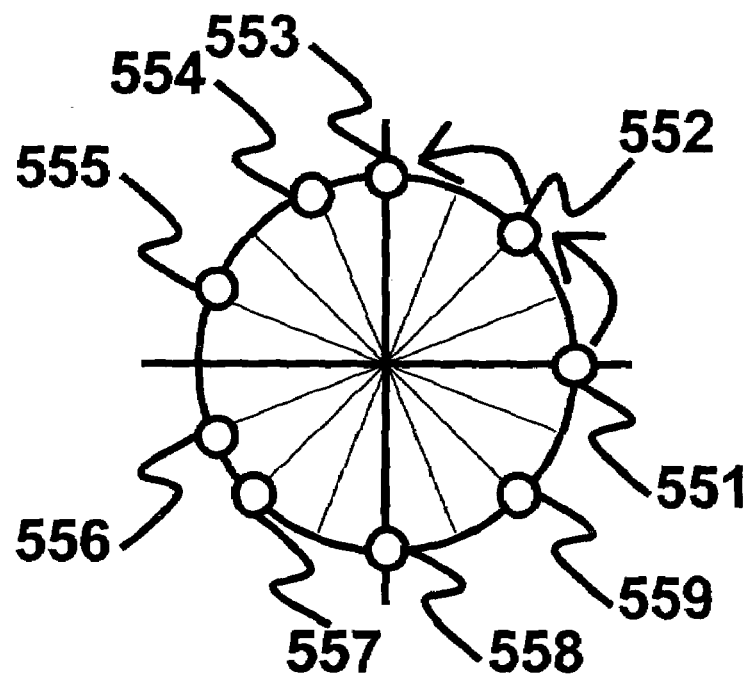
FIG. 25 is a view illustrating the operation of the embodiment 8 of the present invention.

FIG. 25 is a view illustrating the operation of the embodiment 8 of the present invention.

As shown in FIG. 25, an output signal 593 of the randomizer causes a switchover to different phase partition periods to be made.

In FIG. 25, when a switchover to a second control signal 552 is made from a first control signal 551, when a switchover to a third control signal 553 is made from the second control signal 552, when a switchover to a fifth control signal 555 is made from a fourth control signal 554, when a switchover to a sixth control signal 556 is made from the fifth control signal 555, when a switchover to an eighth control signal 558 is made from a seventh control signal 557, and when a switchover to a ninth control signal 559 is made from the eighth control signal 558, each of them is a phase delay of two partitions, whereas when a switchover to the fourth control signal 554 is made from the third control signal 553, and when a switchover to the seventh control signal 557 is made from the sixth control signal 556, each of them is a phase delay of one partition.

Next, the effect of this embodiment will be explained, by making a reference to the accompanied drawings.

Figure 26:
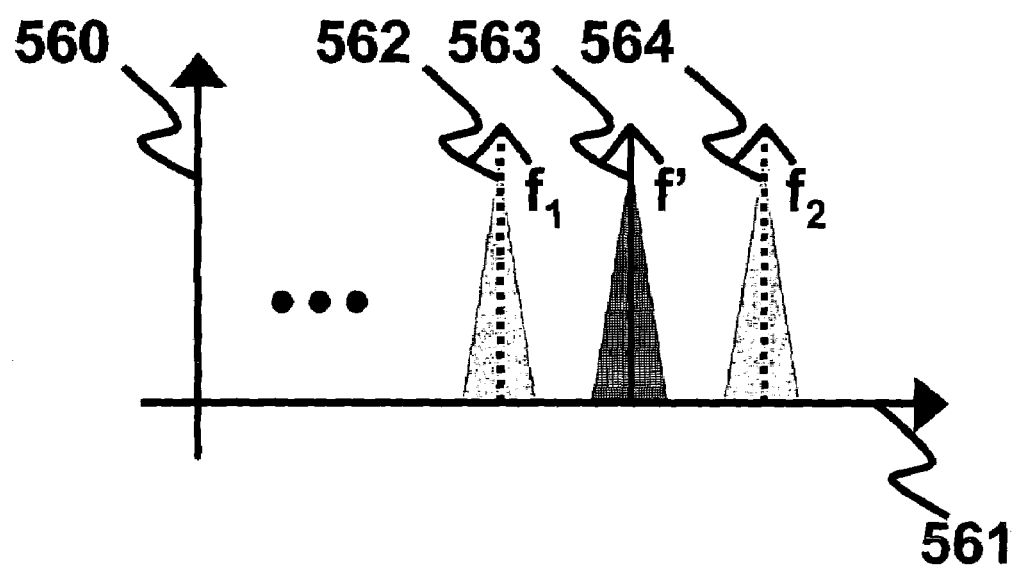
FIG. 26 is a view illustrating the effect of the embodiment 8.

FIG. 26 is a view illustrating the effect of this embodiment.

As shown in FIG. 26, making a switchover between a first phase partition period and a second phase partition period with the randomizer makes it possible to generate a spectrum 563 of the output clock signal at the time of having changed the partition in an arbitrary frequency between a spectrum 562 of the output clock signal when operated at a first fixed partition period, and a spectrum 564 of the output clock signal when operated at a second fixed partition period. Additionally, an axis of ordinate is a spectrum intensity axis 560, whereas an axis of abscissa is a frequency axis 561.

Embodiment 9

Next, an embodiment 9 of the present invention will be explained in details, by making a reference to the accompanied drawings.

Figure 27:
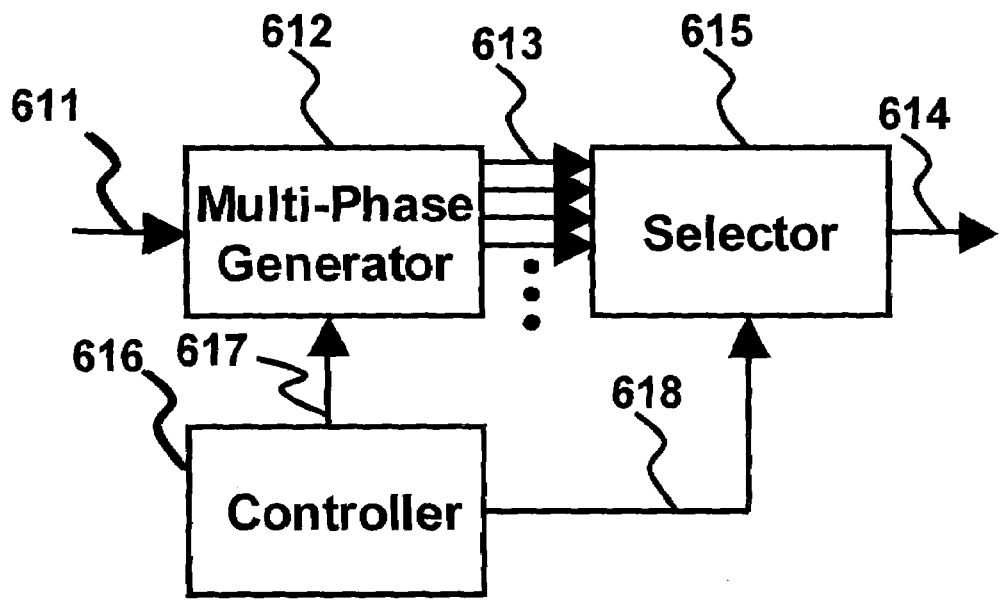
FIG. 27 is a block diagram of the embodiment 9 of the present invention.

FIG. 27 is a block diagram of the embodiment 9 of the present invention.

As shown in FIG. 27, the embodiment 9 is configured of a multi-phase generator 612 for generating multi-phase clock signals 613 from an input clock signal 611, a selector 615 for selecting and generating an output clock signal 614 from among a plurality of these multi-phase clock signals, and a controller 616 for generating control signals of the multi-phase generator 612 and the selector 615 (a control signal 617 of the multi-phase generator, and a control signal 618 of the selector).

Next, a specific circuit configuration of each circuit block will be explained.

Figure 28:
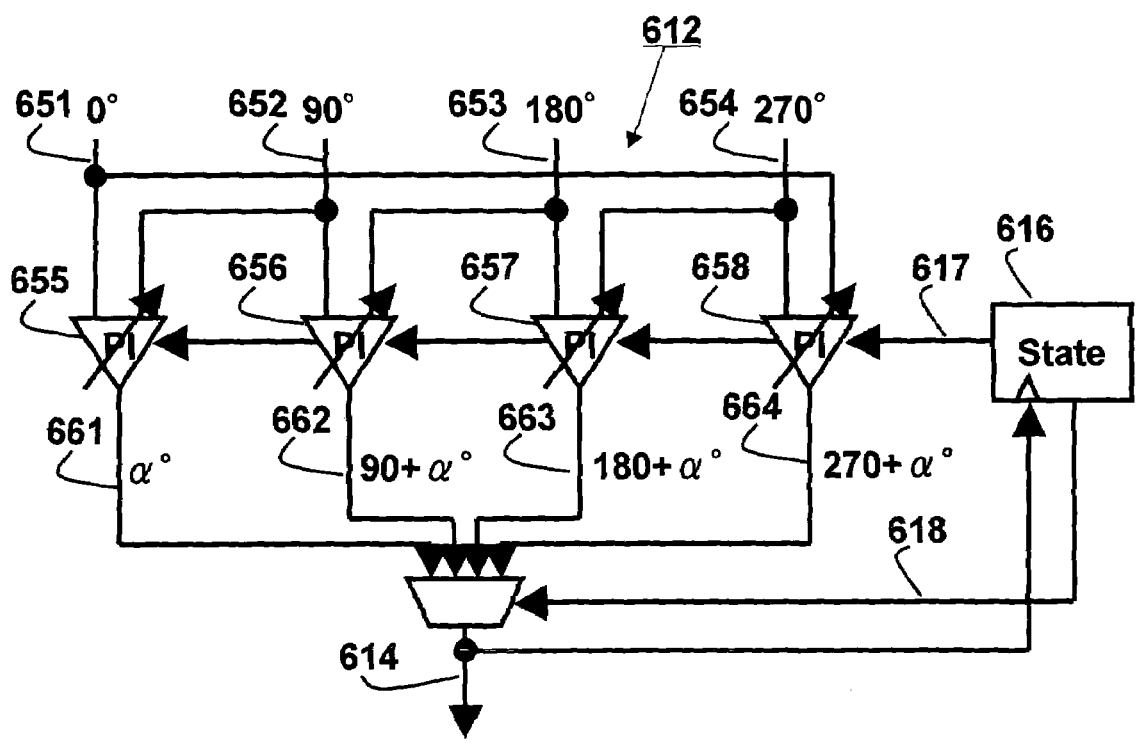
FIG. 28 is a specific circuit configuration view of the multi-phase generator 612, the selector 615, and a controller 616.

FIG. 28 is a specific circuit configuration view of the multi-phase generator 612, the selector 615, and the controller 616.

As shown in FIG. 28, the multi-phase generator 612 is configured of a phase interpolator 655 for generating a signal 661 having a phase of 0° to 90° with a signal 651 having a phase of 0° and a signal 652 having a phase of 90° assumed to be an input respectively, a phase interpolator 656 for generating a signal 662 having a phase of 90° to 180° with the signal 652 having a phase of 90° and a signal 653 having a phase of 180° assumed to be an input respectively, a phase interpolator 657 for generating a signal 663 having a phase of 180° to 270° with the signal 653 having a phase of 180° and a signal 654 having a phase of 270° assumed to be an input respectively, and a phase interpolator 658 for generating a signal 654 having a phase of 270° to 360° (0°) with the signal 654 having a phase of 270° and the signal 651 having a phase of 360° (0°) assumed to be an input respectively.

At this moment, the signal 651 having a phase of 0°, the signal 652 having a phase of 90°, the signal 653 having a phase of 180°, and the signal 654 having a phase of 270° are caused to occur with the phases shifted by 90°, 180°, and 270° from the input clock signal 611 respectively. Also, a control signal 617 of the phase interpolator causes the output phase of each of the phase interpolators 655 to 658 to be switched.

Figure 29:
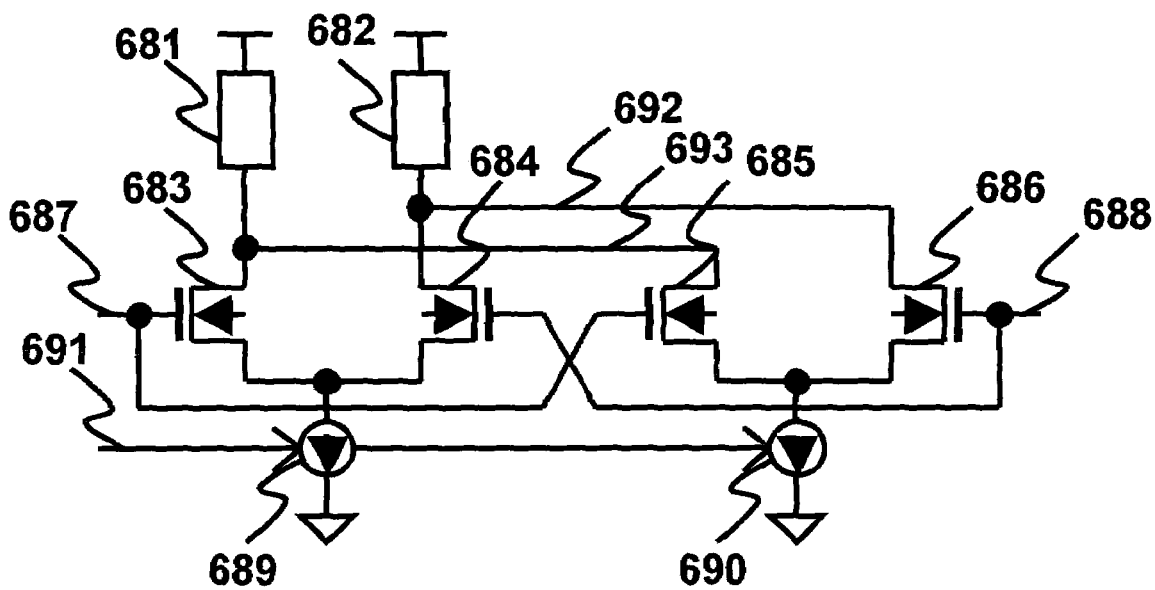
FIG. 29 is a view having the phase interpolators 655 to 658 materialized that are employed for the multi-phase generator 612.

FIG. 29 is a view having the phase interpolators 655 to 658 materialized that are employed for the multi-phase generator 612.

As shown in FIG. 29, in the phase interpolator 655 to 658, a first load circuit 681 is connected to drain ends of a first MOS transistor 683 and a third MOS transistor 685, a second load circuit 682 to drain ends of a second MOS transistor 684 and a fourth MOS transistor 686, a first current source 689 to source ends of the first MOS transistor 683 and the second MOS transistor 684, a second current source 690 to source ends of the third MOS transistor 685 and the fourth MOS transistor 686, a first input signal 687 to gate ends of the first MOS transistor 683 and the third MOS transistor 685, and a second input signal 688 to gate ends of the second MOS transistor 684 and the fourth MOS transistor 686 to output a first output signal 692 and a second output signal 693. At this moment, a control signal 691 of the current source causes the current capacities of the first current source 689 and the second current source 690 to be controlled, and the phase of the output signal to be switched.

In addition hereto, the phase interpolator can be configured also by connecting the outputs of two CMOS inverters to control a driving ability of each inverter.

Also, in FIG. 28, a four-phase cock signal was input; however it can be configured also by employing the clock signal of which the phase number is four or more.

Also, in addition hereto, the multi-phase generator can be configured also by connecting a plurality of delay circuits in series to fetch the output of each delay circuit.

Next, the operation of the control signal of the controller 616 for controlling the multi-phase generator 612 and the selector 615 will be explained in details, by making a reference to the accompanied drawings.

Figure 30:
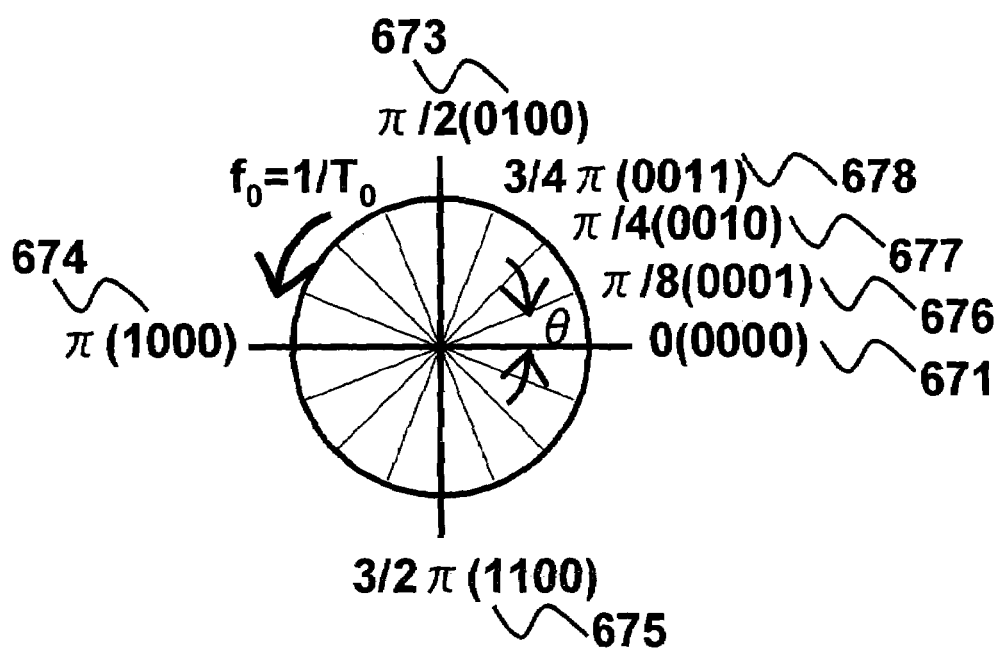
FIG. 30 is a view for explaining the control signal of the controller 616.

FIG. 30 is a view for explaining the control signal of the controller 616.

As shown in FIG. 30, let a control signal 671 for generating the clock signal having a phase 0° be defined as a binary four-bit signal "0000", it follows that a control signal 676 for generating the clock signal having a phase 22.5° having a one-partition phase increased from the phase 0° is "0001", a control signal 677 for generating the clock signal having a phase 45° is "0010", a control signal 678 for generating the clock signal having a phase 62.5° is "0011", a control signal 673 for generating the clock signal having a phase 90° is "0100", further, a control signal 674 for generating the clock signal having a phase 180° is "1000", and a control signal 675 for generating the clock signal having a phase 270° is "1100".

In FIG. 28, when the high-order two-bit pattern of this control signal is "00", the output signal 661 of the phase interpolator for generating a signal having a phase 0° to 90° is selected, when it is "01", the output signal 662 of the phase interpolator for generating a signal having a phase 90° to 180° is selected, when it is "10", the output signal 663 of the phase interpolator for generating a signal having a phase 180° to 270° is selected, and when it is "11", the output signal 664 of the phase interpolator for generating a signal having a phase 270° to 360° (0°) is selected.

Also, the low-order two-bit control signal decides a phase interpolation rate of the phase interpolator. For example, in FIG. 30, the control signal 677 for generating the clock signal having a phase 45° is "0010", and this means that the clock signal having a phase 45° is generated by selecting the output signal 661 of the phase interpolator 665 for generating a signal having a phase 0° to 90° with the high-order two-bit pattern "00" to let the low-order two-bit pattern "10" be defined as the control signal 617 of the phase interpolator.

Also, in a case of delaying the clock signal two partitions by two partitions, the control signal is switched over to the second control signal 677 "0010" for delaying the clock signal by two partitions from the first control signal 671 "0000", to the third control signal 673 "0100" for delaying the clock signal by two partitions from the second control signal 677 "0010", and further is switched so as to delay the clock signal by two partitions respectively.

Figure 31:
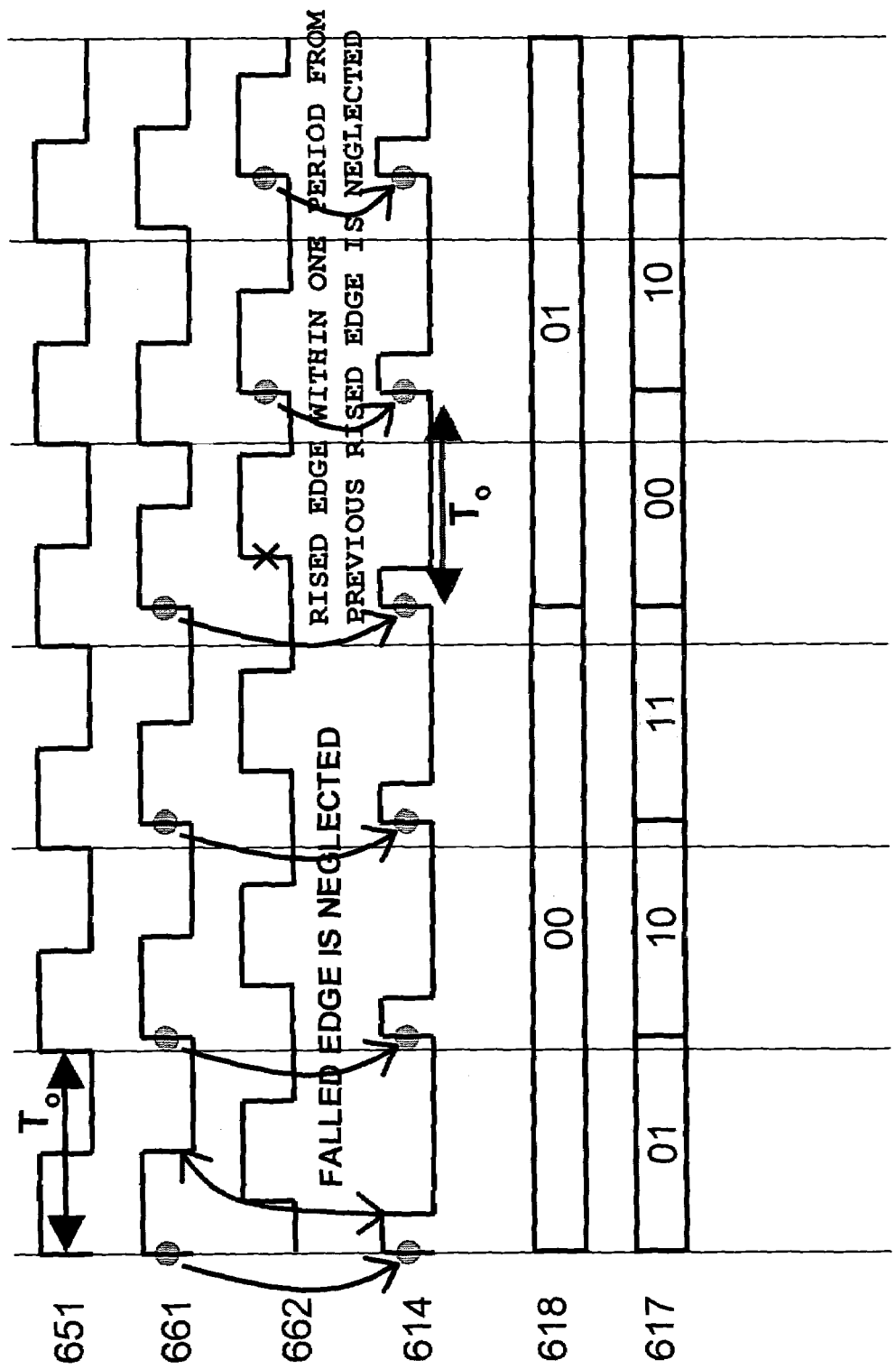
FIG. 31, which is a view explaining the operation of the embodiment 9, is a time chart in a case of shifting the phase of the input clock signal one partition by one partition.

Next, the operation of the embodiment 9 will be explained while a reference to FIG. 28 and FIG. 31 is made.

FIG. 31, which is a view for explaining the operation of the embodiment 9, is a time chart in a case of shifting the phase of the input clock signal one partition by one partition. Additionally, let the phase of one partition be defined as 22.5° in the time chart of FIG. 31. Also, in case of FIG. 31, the phase of the leading edge of the input clock signal is shifted to neglect a trailing-edge signal; however roles of the leading edge and the trailing edge may be reversed.

In FIG. 31, a clock signal 651 having 0°, which has a period $T_0$, is a signal that rises at a phase of 0° at any time.

At first, assume that the control signal 618 of the selector 615 was switched over to "00", and the control signal 617 of the phase interpolator to "01" in the left end of FIG. 31. At this moment, the selector 615 selects an output signal 661 of the phase interpolator 655 of 0° to 90° that is a signal having 22.5°. The leading-edge signal of this output signal 661 of the phase interpolator 655 of 0° to 90° causes the output signal 614 of the selector 615 to output the leading-edge signal. Additionally, this selector has a monostable multi-vibrator housed internally in its output stage, and this monostable multi-vibrator outputs a pulse of which the level becomes high only for a short time as the signal 614 from the leading edge of the selected signal.

Also, by adding "0001" to the controller 616, the control signal 618 of the selector 615 and the control signal 617 of the phase interpolation rate of the phase interpolator are switched over to "10" from "01" respectively, and by shifting the phase of the output signal 661 of the phase interpolator 655 of 0° to 90° by one partition, a switchover to a signal having 45° is made. At this moment, the selector 615 has selected the output signal 661 of the phase interpolator 655 of 0° to 90° as it stands.

Continuously, similarly, the leading-edge signal of the output signal 661 of the phase interpolator 655 of 0° to 90° causes the control signal 614 of the selector 615 to output the leading edge, the control signal 617 of the phase interpolation rate of the phase interpolator to be switched over to "11" from "10", and the phase of the output signal 661 of the phase interpolator 655 of 0° to 90° to be shifted one partition by one partition to obtain a signal having 67.5°.

And, when the leading-edge signal of the output signal 661 of the phase interpolator 655 of 0° to 90° comes next, the control signal 618 of the selector 615 that has not been changed so far is switched over to "01" from "00", and the output signal of the selector 615 is switched over to the output signal 661 of the phase interpolator 655 in 0° to 90° from the output signal 662 of the phase interpolator 656 in 90° to 180°.

Also, the control signal 617 of the phase interpolation rate of the phase interpolator is "00", whereby the output signal 662 of the phase interpolator 656 of 90° to 180 becomes a signal having 90°. At this moment, the output signal 662 of the phase interpolator 656 of 90° to 180° that exists within one period from the leading edge of the output signal 614 of the selector 615 is not output. Hereinafter, the operation is performed similarly to the foregoing.

Next, the operation in a case where the phase of the input clock signal is shifted two partitions by two partitions will be explained.

Figure 32:
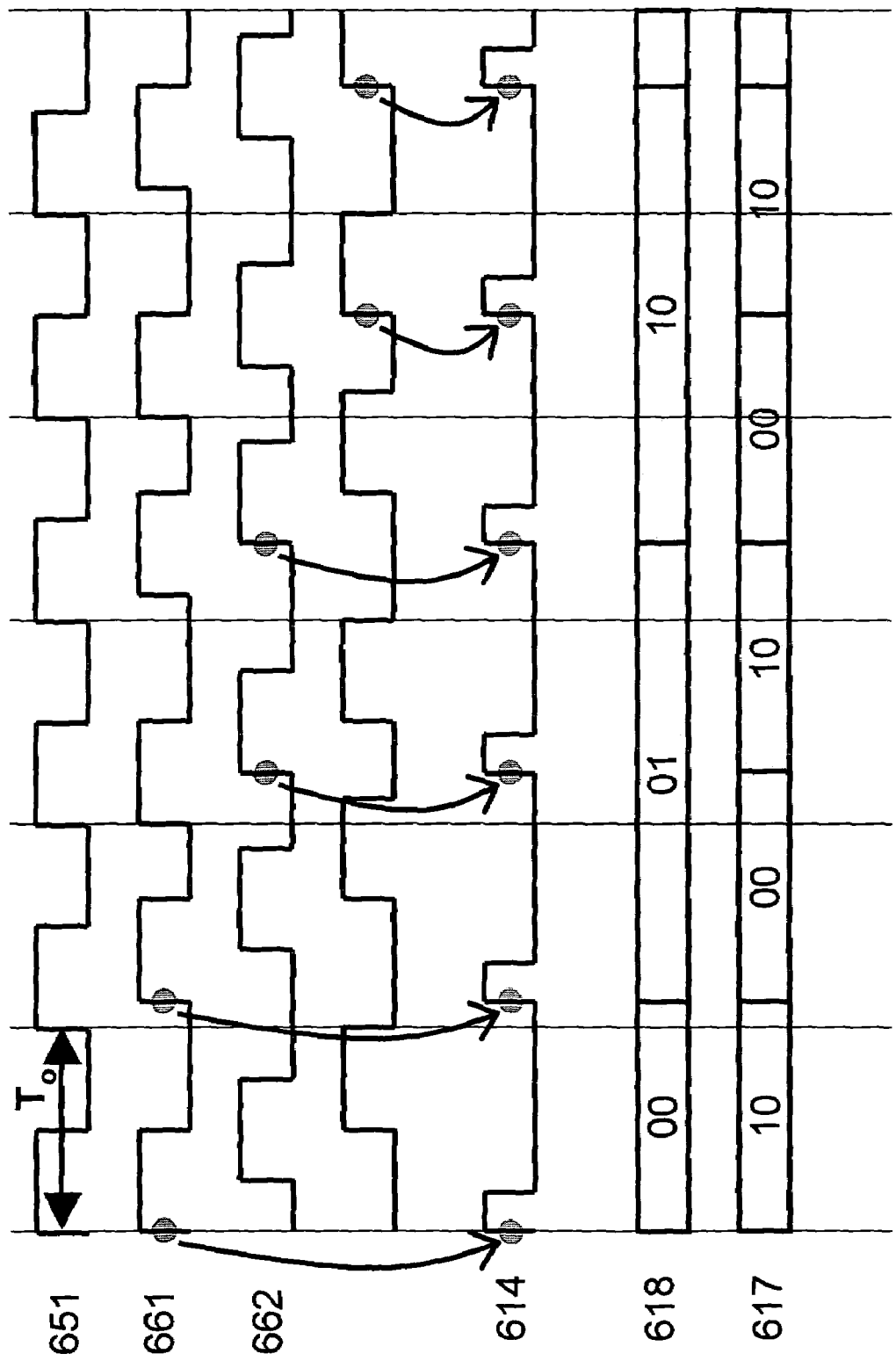
FIG. 32 is which is a view explaining the operation of the embodiment 9, is a time chart in a case of shifting the phase of the input clock signal two partitions by two partitions.

FIG. 32, which is a view for explaining the operation of the embodiment 9, is a time chart in a case of shifting the phase of the input clock signal two partitions by two partitions. Additionally, let the phase of two partitions be defined as 45° in the time chart of FIG. 32. Also, in case of FIG. 32, the phase of the leading edge of the input clock signal was shifted to neglect the trailing-edge signal; however roles of the leading edge and the trailing edge may be reversed.

In FIG. 32, at first, assume that the control signal 618 of the selector 615 was switched over to "00", and the control signal 617 of the phase interpolation rate of the phase interpolator to "10" in the left end of FIG. 32.

At this moment, the selector 615 has selected the output signal 661 of the phase interpolator 655 of 0° to 90° that is a signal having 45°. The leading-edge signal of this output signal 661 of 0° to 90° causes the output signal 614 of the selector 615 to output the leading-edge signal similarly to the operation of FIG. 31.

Also, by adding "0001" to the controller 616, the control signal 618 of the selector 615 is switched over to "01", and the control signal 617 of the phase interpolation rate of the phase interpolator to "00".

The control signal 618 of the selector 615 causes the selector 615 to make a switchover to the output signal 662 of the phase interpolator 656 of 90° to 180° from the output signal 661 of the phase interpolator 655 of 0° to 90°.

Also, the control signal 617 of the phase interpolation rate of the phase interpolator causes the output signal 662 of the phase interpolator 656 of 90° to 180° to become a signal having 90°. Hereinafter, the operation is performed similarly to the foregoing.

Embodiment 10

An embodiment 10 of the present invention will be explained.

Figure 33:
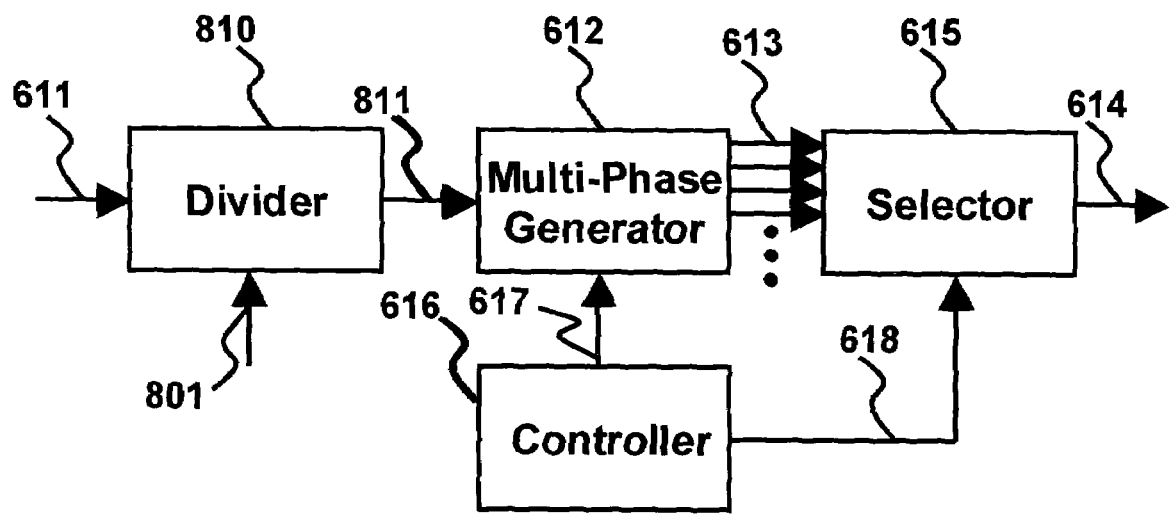
FIG. 33 is a block diagram of the synthesizer of the embodiment 10.
Figure 35:
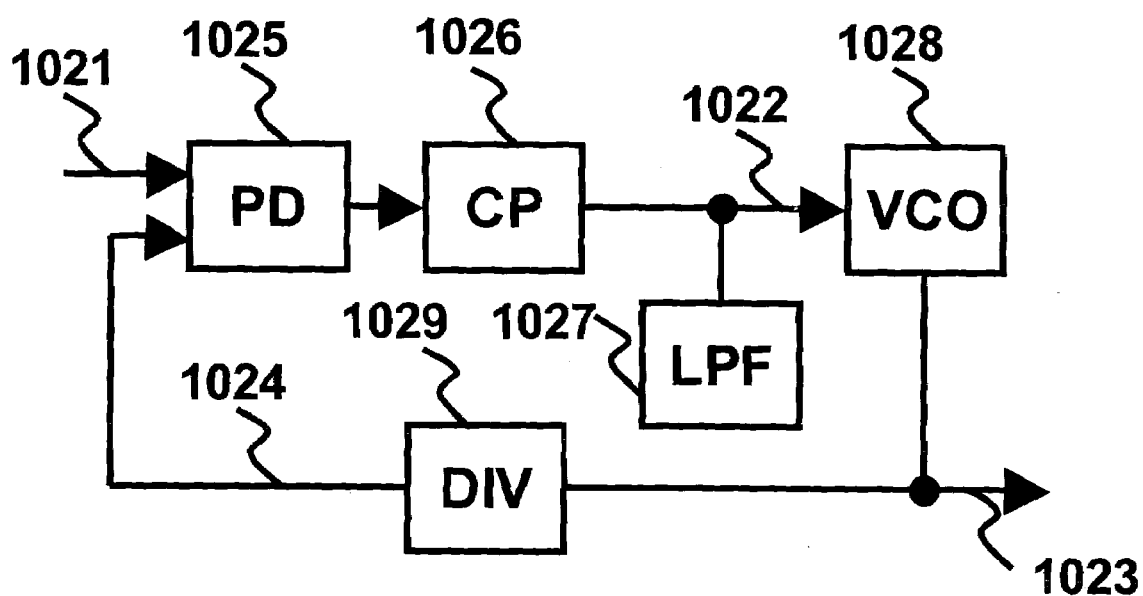
FIG. 35 is a block diagram of the first conventional synthesizer.

FIG. 33 is a block diagram of the synthesizer of the embodiment 10.

As shown in FIG. 33, the synthesizer of the embodiment 10 differs in having a divider 810 in addition to the embodiment 9.

Having the divider 810 makes it possible to divide an input signal 811 that is input into the multi-phase generator 612 into a plurality of signals different from the input clock signal 611, whereby more numerous kinds of the output signals are obtained as compared with the embodiment 9.

Embodiment 11

An embodiment 11 of the present invention will be explained.

Figure 34:
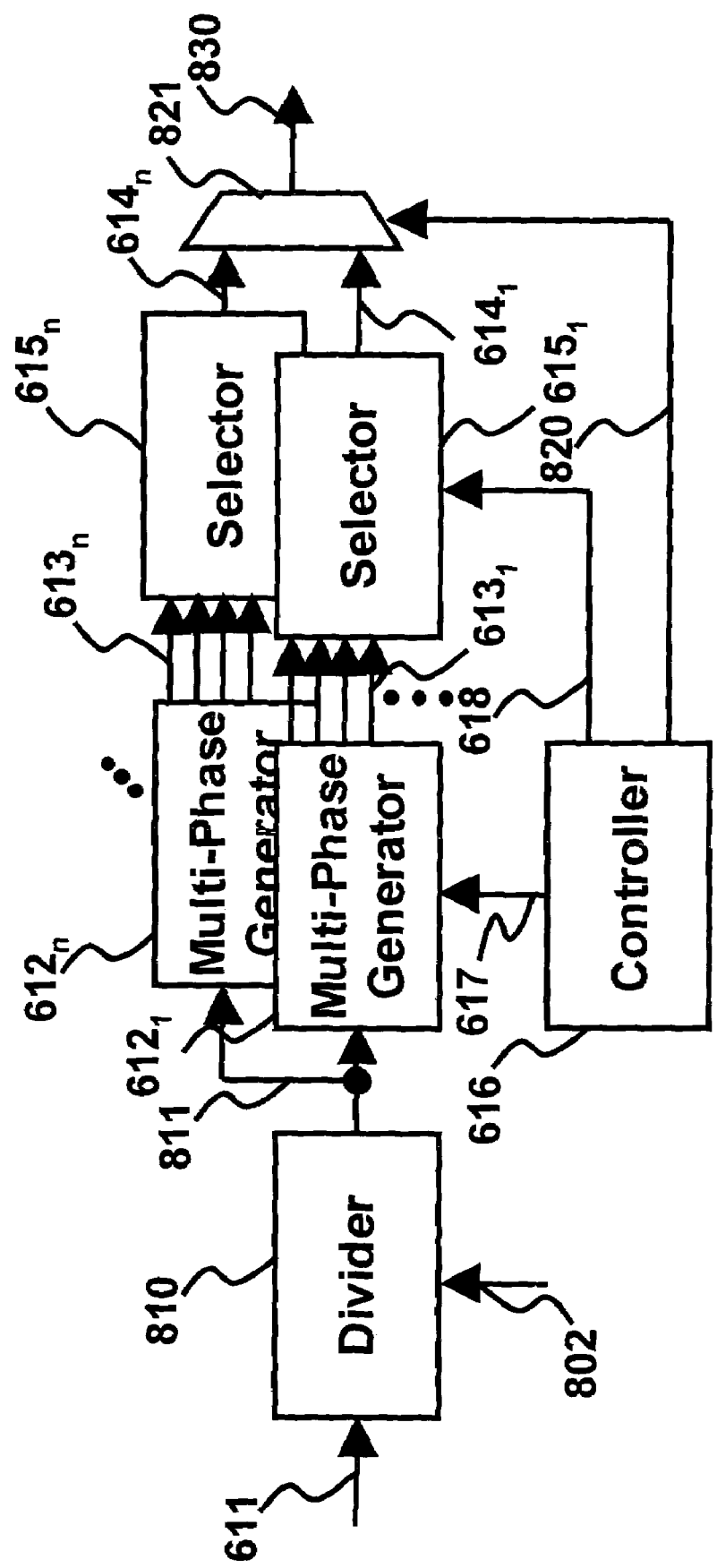
FIG. 34 is a block diagram of the synthesizer of the embodiment 11.
Figure 36:
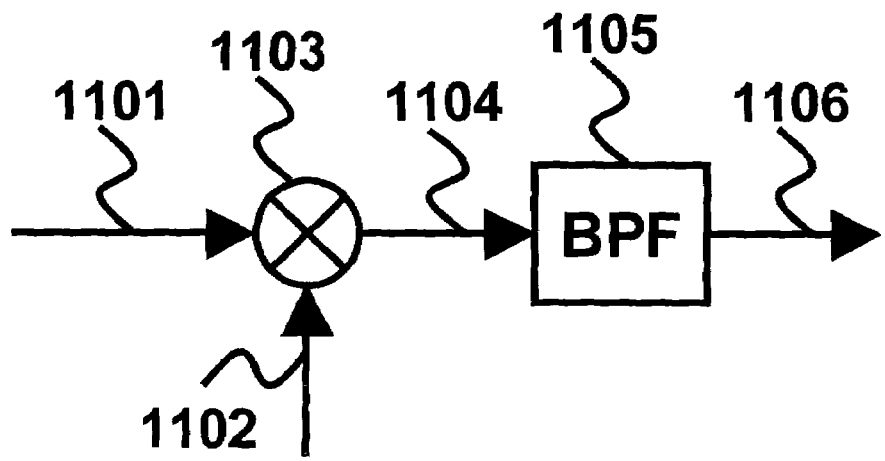
FIG. 36 is a block diagram of the second conventional synthesizer.
Figure 37:
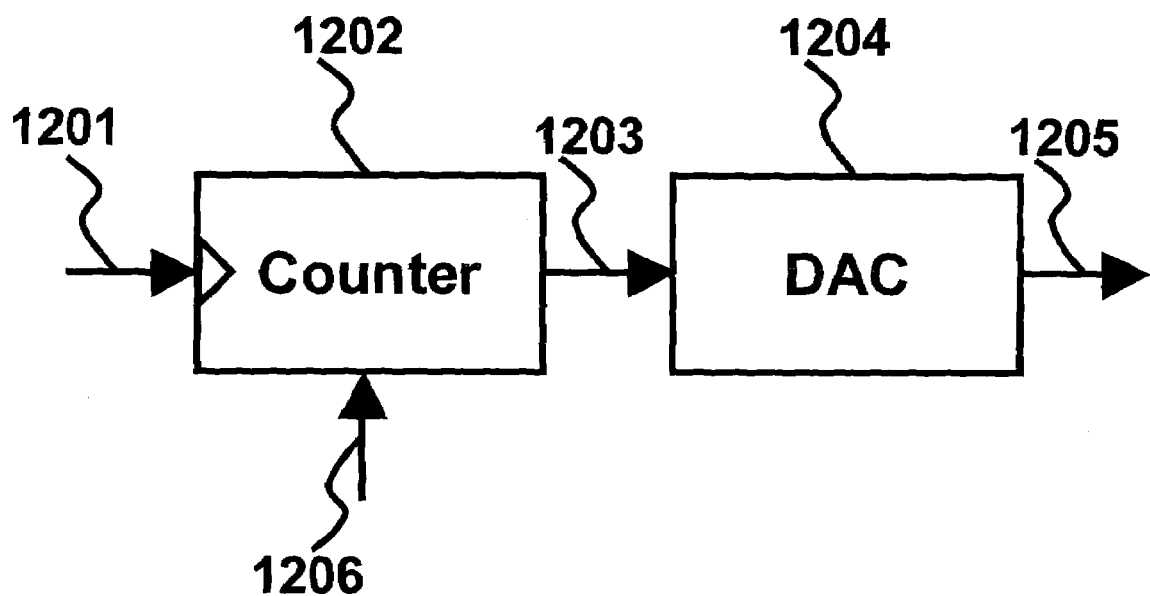
FIG. 37 is a block diagram of the third conventional synthesizer.

FIG. 34 is a block diagram of the synthesizer of the embodiment 11.

As shown in FIG. 34, the synthesizer of the embodiment 11 differs in having a plurality of multi-phase generators $612_1$ to $612_n$, a plurality of selectors $615_1$ to $615_n$, and a selector 821 in addition to the embodiment 9 and the embodiment 10.

Making the number of the multi-phase generator and the selector plural allows a signal having a period shorter than that of the input clock signal to be generated.

Embodiment 12

An embodiment 12 of the present invention will be explained.

Figure 38:
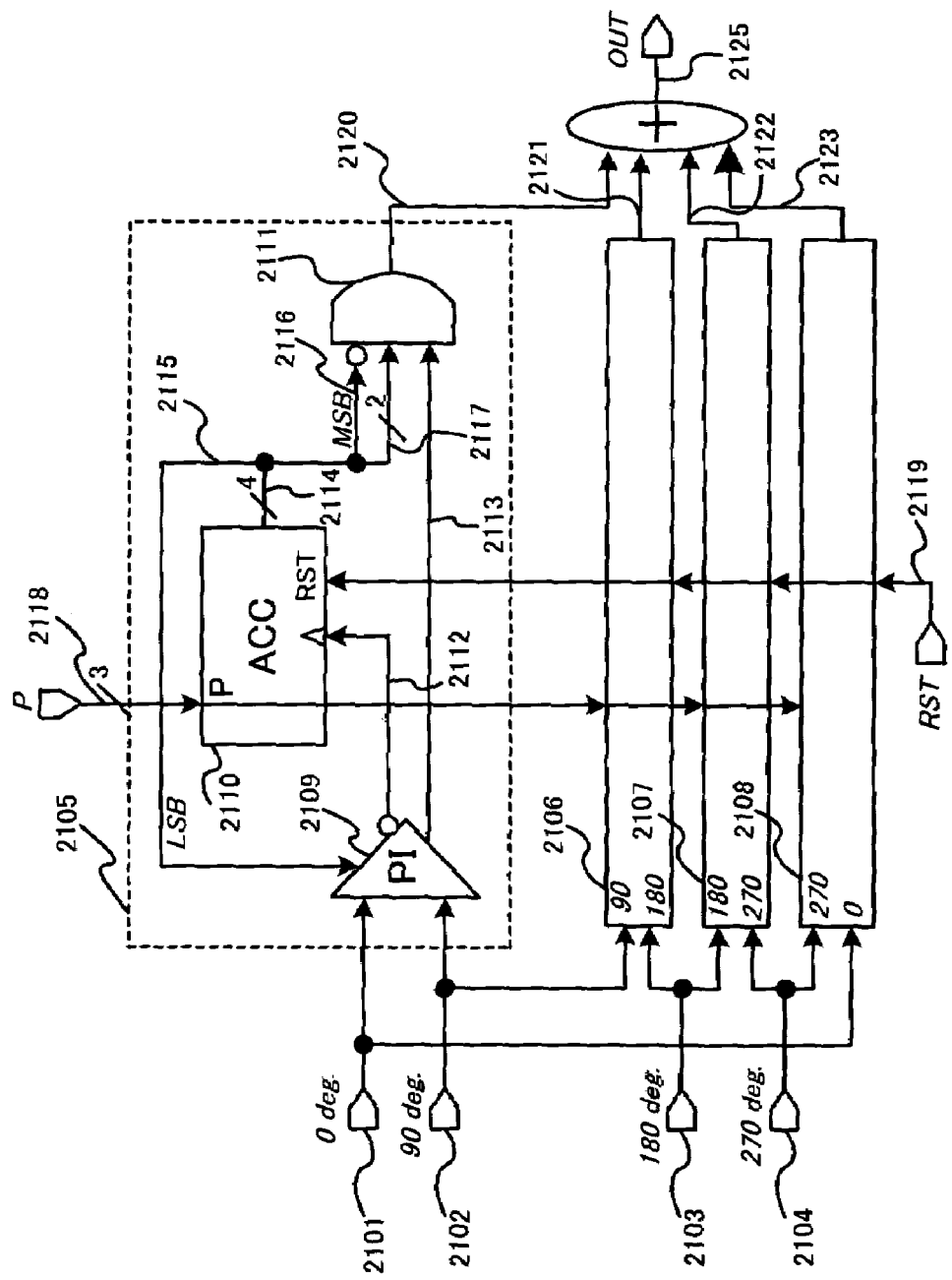
FIG. 38 is a block diagram of the synthesizer of the embodiment 12.

FIG. 38 is a block diagram of the synthesizer of the embodiment 12.

As shown in FIG. 38, the synthesizer of the embodiment 12 is configured of first to fourth pulse generators 2105 to 2108 of which the input signal are four-phase (0°, 90°, 180°, and 270°) clocks 2101 to 2104 respectively, and a adder 2125 for adding outputs 2120 to 2123 of these pulse generator.

The first pulse generator 2105 is configured of a phase interpolator 2109, an accumulator 2110, and a gate circuit 2111. The second to fourth pulse generators are also configured similarly. In the pulse generator, clocks of the neighboring phases, i.e. clocks of 0° and 90° in this case are input into the phase interpolator 2109.

In the phase interpolator, out of a control signal 2114 from the accumulator, the value of a least significant bit 2115 causes the phases of outputs 2112 and 2113 to be switched. However, 2112 and 2113 are differential signals.

Normally, the accumulator adds and accumulates the value of a three-bit control signal 2118 one cycle by one cycle of the output of the phase interpolator, and outputs a four-bit pattern by adding one bit. The accumulator can accumulates the values up to the value of "111"; however when the overflow occurs at some cycle, said added value of one bit is changed, which causes the addition to stop. And, by re-returning said value of one bit to the value prior to the overflow at the next cycle, the addition is performed similarly until the next overflow. Of four-bit output 2114 of the accumulator, high-order three-bit outputs 2116 and 2117 are employed for the control signal of the gate circuit, and also, as mentioned before, a least significant bit 2115 is employed for the control signal of the phase interpolator. The most significant bit 2116 is a bit that changes in the value due to said overflow.

The gate circuit allows the output 2113 of the phase interpolator to pass when the two-bit control signal 2117 from the accumulator is equal to a certain unique value, and yet no overflow occurs. Conversely, it does not allow the output 2113 of the phase interpolator to pass under the condition other than this. Said unique value differs respectively in each gate circuit of the first to the fourth pulse generators.

A reset signal 2119 causes the values of all accumulators to be reset, that is, to be altered to an identical value. Normally, this value is "0".

Next, a specific operation will be explained while a reference to the accompanied drawings is made.

Figure 39:
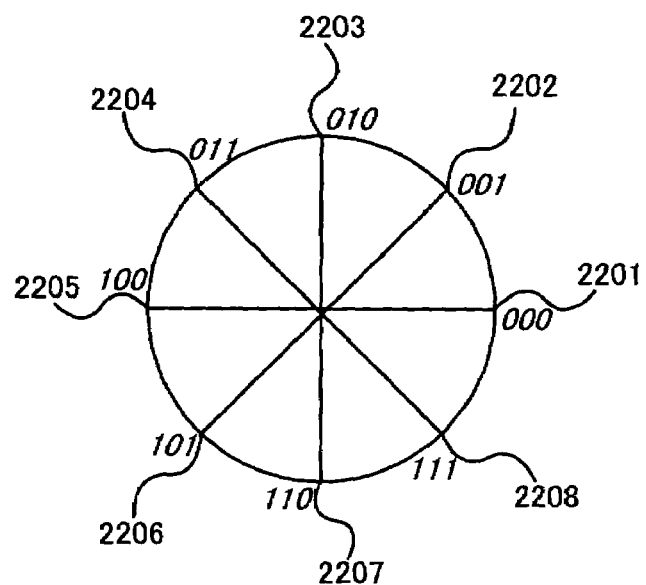
FIG. 39 is a vector view illustrating the output phase of the phase interpolator in the first to the fourth pulse generators 2105 to 2108.

FIG. 39 is a vector view illustrating the output phase of the phase interpolator in the first to the fourth pulse generators 2105 to 2108.

As shown in FIG. 39, the output phase of said phase interpolator transits three-bit states, i.e. eight states. Output phases of 0° to 315° 2201 to 2208 of said phase interpolator are represented with the values of binary codes ranging from "000" to "111" respectively. However, not the binary code but a gray code etc. may be employed.

Figure 40:
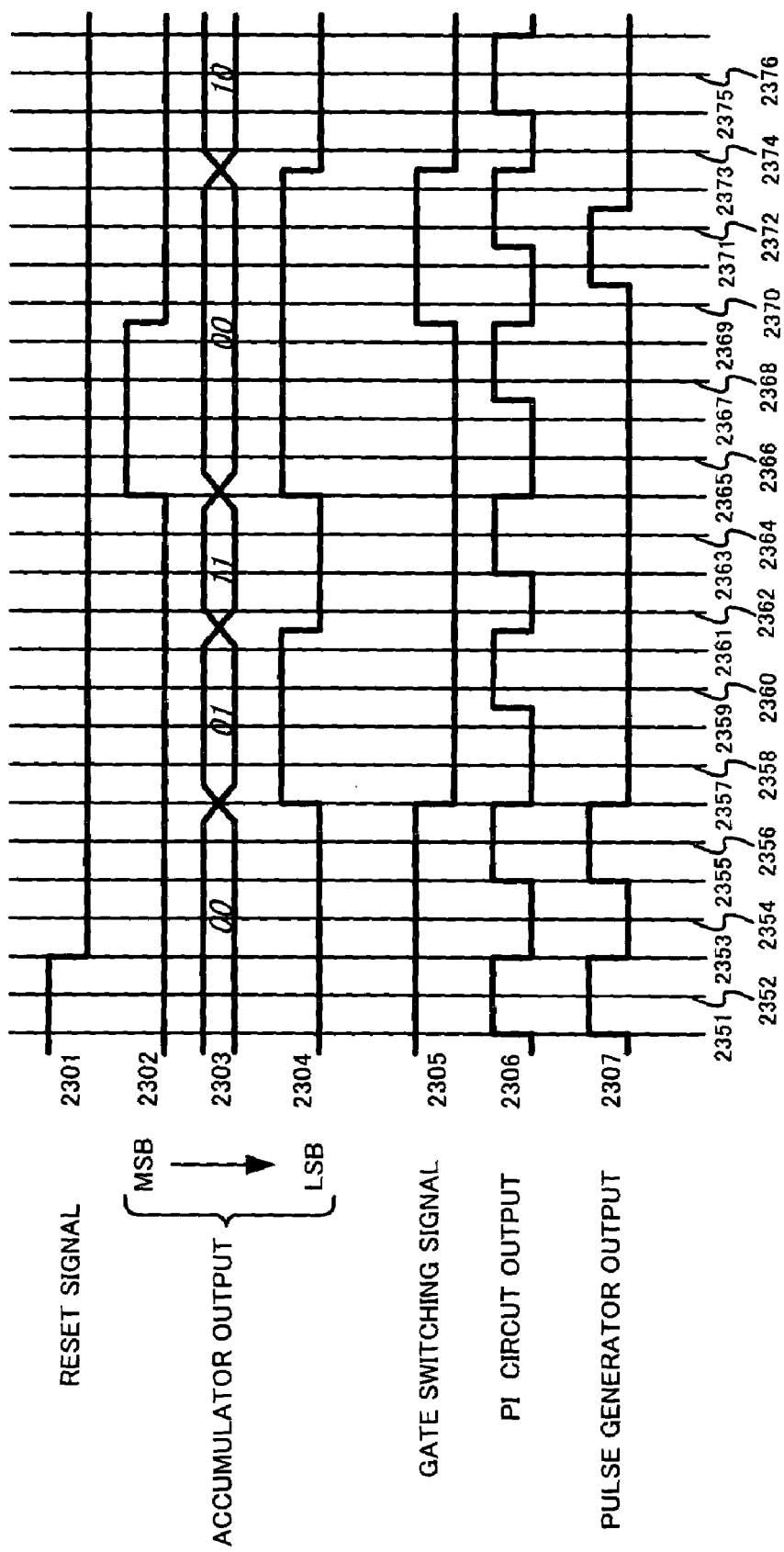
FIG. 40 is a time chart view of the pulse generator in a case where the gate circuit 2111 allows the output 2113 of the phase interpolator to pass when the control signal 2118 is "011" and the control signal 2117 from the accumulator is "00" in the synthesizer of the embodiment 12.

FIG. 40 is a time chart view of the pulse generator in a case where the gate circuit 2111 allows the output 2113 of the phase interpolator to pass when the control signal 2118 is "011", and the control signal 2117 from the accumulator is "00" in the synthesizer of the embodiment 12. However, in this time chart view, a case of switching the phase of the leading edge of a pulse generator output 2307 will be explained. A case of switching the phase of the trailing edge is also similar.

As shown in FIG. 40, when a reset signal 2301 is "1", that is, in the meantime ranging from a time 2351 to a time 2353, accumulator outputs 2302 to 2304 are "0" at any time. However, the accumulator output 2302 is a bit of which the value is changed depending upon said overflow, the accumulator output 2303 is a two-bit output of the control signal 2117 from the said accumulator, and the accumulator output 2304 is a one-bit output of the control signal 2117 of said phase interpolator. Also, these four bits respond in order of the most significant bit to the least significant bit, whereby for example, the accumulator output 2302 is identical to the most significant bit. At this moment, the output 2303 of the accumulator is "00", whereby a gate switching signal 2305 becomes "1", and an output 2306 of the phase interpolator becomes a pulse generator output 2307 as it stands, that is, a phase 0° 2201 is output. However, the gate switching signal 2305 is a signal of which the state is decided depending upon the accumulator outputs 2302 and 2303.

Next, when the reset signal is "0", that is, in the meantime ranging from a time 2353 to a time 2377, the accumulator output is changed with a fall time of the phase interpolator output 2306. At the time 2357, "011" is added to the accumulator, the accumulator output 2303 is changed from "00" to "01", and also the accumulator output 2304 is changed from "0" to "1". The accumulator output 2304 causes the phase of the leading edge of the phase interpolator output 2306 to be switched over to the phase in the middle of the time 2359 and the time 2360, i.e. the phase of 45° from the phase at the time 2359, i.e. the phase of 0°. Similarly, the phase of the trailing edge of the phase interpolator output 2306 is also switched over to the phase in the middle of the time 2361 and the time 2362. At this moment, the accumulator output 2303 is different from "00", whereby the gate switching signal 2305 is changed from "1" to "0", and the phase interpolator output 2306 is not allowed to pass through the gate circuit, that is, the pulse generator output 2307 is "0". "011" is added to the accumulator also in the middle of the time 2361 and the time 2362, and the operation is performed similarly.

Said overflow occurs at the time 2365, whereby the accumulator output 2303 is changed from "11" to "00", also the accumulator output 2304 is changed from "0" to "1", and further the accumulator output 2302 is changed from "0" to "1". The accumulator output 2304 causes the phase of the leading edge of the phase interpolator output 2307 to be switched over to the phase in the middle of the time 2367 and the time 2368, i.e. the phase of 45° from the phase at the time 2367, i.e. the phase of 0°. At this moment, even though the accumulator output 2303 is "00", the accumulator output 2302 is "1", whereby the gate switching signal 2305 remains "0". For this, the phase interpolator output 2306 is not allowed to pass through the gate circuit.

The accumulator outputs 2303 and 2304 are not changed at the time of the next trailing edge of the output of the phase interpolator, i.e. in the middle of the time 2369 and the time 2370; however the accumulator output 2302 is returned from "1" to "0". This causes the gate switching signal 2305 to be changed from "0" to "1", whereby the phase interpolator output 2306 passes through the gate circuit, and the phase 45° is output.

In addition hereto, the remaining three pulse generators is a pulse generator in which the gate circuit allows the output of the phase interpolator to pass when the two-bit control signals from said accumulator are "01", "10", and "11" respectively. These pulse generators also operate similarly except that the two-bit control signal with witch the gate circuit allows the output of the phase interpolator to pass is different.

Figure 41:
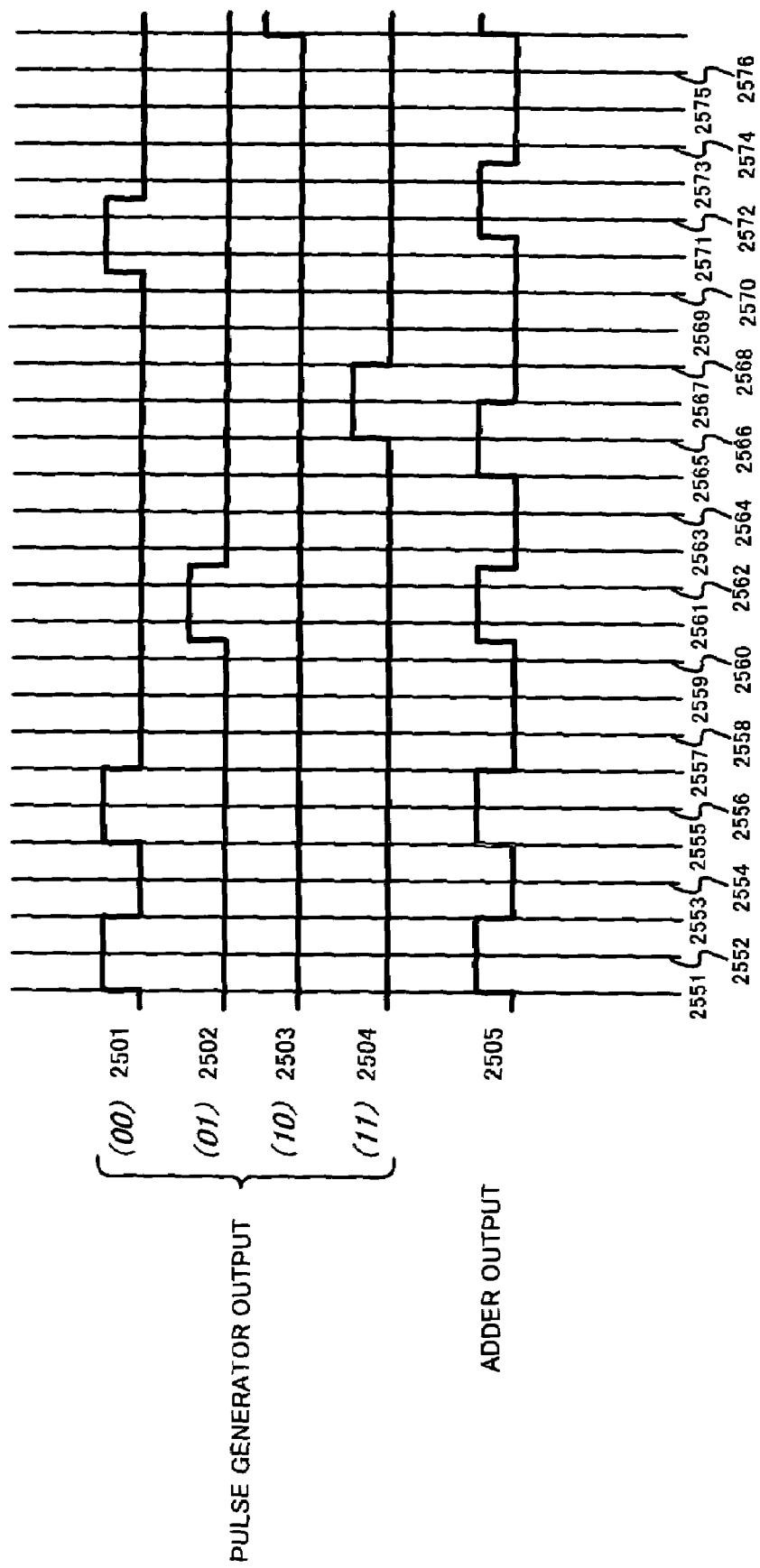
FIG. 41 is a time chart view of the outputs 2501 to 2504 of the pulse generator, and the output 2125 of the adder in the synthesizer of the embodiment 12.

FIG. 41 is a time chart view of outputs 2501 to 2504 of the pulse generator, and an output 2125 of the adder in the synthesizer of the embodiment 12. The outputs of the pulse generators in which the gate circuit allows the output of the phase interpolator to pass when the two-bit control signals from said accumulator are "01", "10", and "11" respectively correspond to 2501 to 2504 respectively. However, a combination of the order of the first to the fourth pulse generators 2105 to 2108 and said two-bit control signal is not unique. Additionally, times 2551 to 2577 have the times identical to that of the times 2351 to 2377 respectively.

Only the value of the pulse generator output 2501 is changed in the meantime ranging from the time 2551 to the time 2557, and the remaining pulse generator outputs 2502 to 2504 are "0" respectively, whereby a result of the addition leads to that the pulse generator output 2501 is an adder output 2505, that is, the phase of 0° is output. Similarly, only the value of one pulse generator output is caused to change, whereby a change in all pulse generator outputs 2502 to 2504 is output as an addition output. In the output 2502 of the pulse generator, the leading edge, i.e. a phase 135° 011 is output in the middle of the time 2560 and the time 2561. Also, in the output 2504 of the pulse generator, a phase 270° 110 is output at the time 2566, and further, in the output 2501 of the pulse generator, a phase 45° 001 is output in the middle of the time 2571 and the time 2572. That is, the phase is switched 135° by 135°, i.e. "011" by "011".

The period ranging from the time 2555 to the time 2577 amounts to 11/8 times the period ranging from the time 2551 to the time 2555, i.e. the period of the input clocks 2101 to 2104. Thus, it follows that the frequency of the time 2555 to the time 2577 is 8/11 times the frequency of the input clock. The value of the control signal 2118 causes this frequency to be switched.

Next, the circuit having said synthesizer generalized will be explained.

Figure 42:
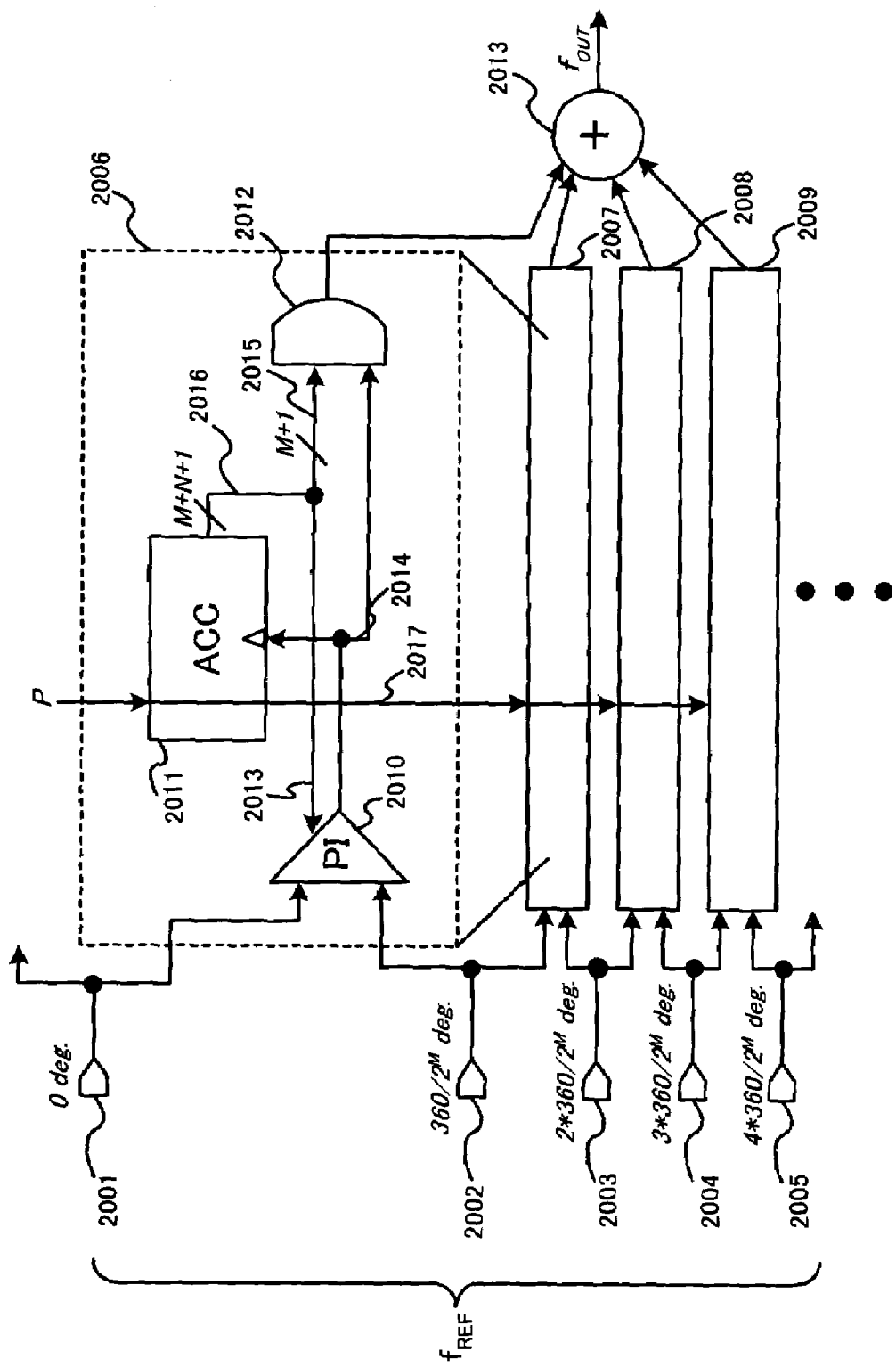
FIG. 42 is a block diagram of the synthesizer of the embodiment 12 when the bit number of the control signal of the gate circuit including no bit of the overflow is M, and the bit number of the control signal of the phase interpolator is N.

FIG. 42 is a block diagram of the synthesizer of the embodiment 12 when the bit number of the control signal of the gate circuit including no bit of the overflow is M, and the bit number of the control signal of the phase interpolator is N.

As shown in FIG. 42, the synthesizer is configured of M pulse generators 2006 to 2009 of which the input signal is M-phase clocks 2001 to 2005 respectively, and an adder 2013 for adding the outputs of these pulse generators. A case of FIG. 38 is equivalent to a case where M=2 and N=1. However, M is equal to the bit number of said control signal.

The frequency of the output of this synthesizer is expressed in the Equation 1.

$$f_{OUT} = \frac{1}{1 + \frac{P}{2^{M+N}}} \cdot f_{REF} \quad (1)$$

$$(P < 2^{M+N})$$

Where, $f_{OUT}$ is the frequency of the output, $f_{REF}$ is the frequency of the input, M is the bit number of the control signal of the gate circuit including no bit of the overflow, N is the bit number of the control signal of the phase interpolator, and P is the value of the control signal that is added to the accumulator.

Next, a specific configuration of the accumulator 2011 will be explained while a reference to the accompanied drawings is made.

Figure 43:
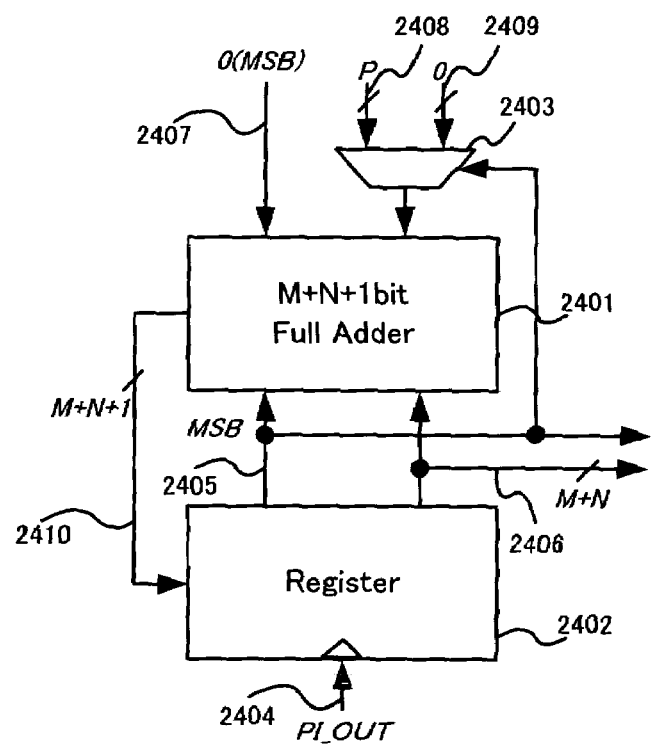
FIG. 43 is a block diagram having the configuration of the accumulator 2011 materialized in the synthesizer of the embodiment 12.

FIG. 43 is a block diagram having the configuration of the accumulator 2011 materialized in the synthesizer of the embodiment 12.

As shown in FIG. 43, it is configured of an (M+N+1)-bit full adder 2401, a register 2402 for holding the value of the result of the full adder, a selector 2403 for selecting one of a value P and "0" of said control signal, i.e. 2048 and 2049 responding to the value of a most significant bit (overflow bit) 2045 of the register. Where, M and N are said bit number respectively.

The register incorporates an output 2410 of the full adder cycle by cycle of an output 2404 of the phase interpolator to hold its value until the next cycle.

The full adder adds values 2405 and 2406 that were held in the register, and the value P of said control signal when the most significant bit is 0. On the other hand, when the overflow occurred, the most significant bit is changed to 1, whereby the selector selects "0", which is input into the full adder.

As mentioned above, in the embodiment 12, housing the accumulator in each pulse generator internally allows the output of the synthesizer to be obtained by making a simple addition of the output of each pulse generator.

The foregoing present invention can be applied for the synthesizer that requires that the frequency of the output clock signal be switched at a high speed.

Also, the foregoing present invention can be applied for the synthesizer that requires that the frequency of the output clock signal be switched in a broad band.

Also, the foregoing present invention can be applied for the synthesizer that requires that the period of the output clock signal that is switched be partitioned, or the period length of the output clock signal that is switched be finely adjusted at a period equal to or less than the period of the input clock signal.

Further, the synthesizer for which the present invention was applied is particularly effective in the wireless system for making a frequency hopping.

What is claimed is:

1. A synthesizer comprising:
    a plurality of pulse generators each including a first circuit that receives a multi-phase clock signal and generates at least one signal, an accumulator that receives a first signal from the first circuit and generates a control signal at a cycle of said first signal, and a gate circuit that selectively passes a second signal from the first circuit based on the control signal that is received from the accumulator; and
    a second circuit that receives the second signal, which is selectively passed, from each gate circuit of the plurality of pulse generators and outputs a sum of the first and second signals that are received.

2. The synthesizer according to claim 1, wherein said first circuit comprises a phase interpolator.

3. The synthesizer according to claim 2, wherein said phase interpolator receives a least significant bit of the control signal output from said accumulator and switches phases of the first and second signals that are output by the phase interpolator based on the least significant bit of the control signal from the accumulator.

4. The synthesizer according to claim 1, wherein gate circuit passes said second signal if the control signal is equal to a predetermined value and prevents said second signal from being passed if the control signal is not equal to the predetermined value.

5. The synthesizer according to claim 4, wherein the predetermined value includes at least two bits of the control signal other than a least significant bit.

6. The synthesizer according to claim 1, wherein said second circuit comprises an adder, wherein said adder outputs the sum of the outputs of the gate circuits from each of said plurality of pulse generators.

7. The synthesizer according to claim 1, wherein the sum of the first and second signals, which is output by the second circuit, is a signal having a greater number of phase partitions than the multi-phase clock signals received by the plurality of pulse generators.

8. The synthesizer according to claim 1, wherein the first signal and the second signal are differential clock signals which are generated by the plurality of pulse generators, said first signal being one of the differential clock signals and said second signal being another of the differential clock signals.

* * * * *